US012751161B2

(12) United States Patent
Huang et al.

(10) Patent No.: US 12,751,161 B2
(45) Date of Patent: Sep. 29, 2026

(54) DISPLAY SUBSTRATE WITH OVERLAPPED MAIN ELECTRODE AND POWER SUPPLY SIGNAL LINE, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yao Huang, Beijing (CN); Binyan Wang, Beijing (CN); Meng Li, Beijing (CN); Tianyi Cheng, Beijing (CN)

(73) Assignees: CHENGDU BOE OPTOELECTRONICS TECHNOLOGY CO., LTD., Chengdu (CN); BOE TECHNOLOGY GROUP CO., LTD, Beijing (CN)

( * ) Notice: Subject to any disclaimer, the term of this patent is extended or adjusted under 35 U.S.C. 154(b) by 569 days.

(21) Appl. No.: 18/249,112

(22) PCT Filed: May 31, 2022

(86) PCT No.: PCT/CN2022/096339

§ 371 (c)(1),
(2) Date: Apr. 14, 2023

(87) PCT Pub. No.: WO2023/230873

PCT Pub. Date: Dec. 7, 2023

(65) Prior Publication Data

US 2025/0089483 A1 Mar. 13, 2025

(51) Int. Cl.

| | |
|---|---|
| ***H10K 59/131*** | (2023.01) |
| ***H10K 59/123*** | (2023.01) |
| ***H10K 59/80*** | (2023.01) |

(52) U.S. Cl.

CPC ......... *H10K 59/131* (2023.02); *H10K 59/123* (2023.02); *H10K 59/80515* (2023.02)

(58) Field of Classification Search

CPC ............... H10K 59/131; H10K 59/123; H10K 59/80515; G09G 3/3208

See application file for complete search history.

(56) References Cited

U.S. PATENT DOCUMENTS

| | | | |
|---|---|---|---|
| 6,246,179 | B1 | 6/2001 | Yamada |
| 10,038,097 | B2 | 7/2018 | Fang et al. |

(Continued)

FOREIGN PATENT DOCUMENTS

| | | | |
|---|---|---|---|
| CN | 104036700 | A | 9/2014 |
| CN | 104637437 | A | 5/2015 |

(Continued)

OTHER PUBLICATIONS

The First Chinese Office Action dated Apr. 1, 2026; Appln. No. 202280001612.5.

*Primary Examiner* — Chad M Dicke
*Assistant Examiner* — Jeremy Daniel Watts
(74) *Attorney, Agent, or Firm* — Frank Gao, Esq.

(57) ABSTRACT

A display substrate is provided. In a third direction perpendicular to the base substrate, at least one power supply signal line includes a first power supply part overlapping with a main electrode of at least one of the first subpixels, the first power supply part includes a first main portion and a second main portion; in the second direction, a maximum size of the main electrode of the first subpixel is not smaller than that of its corresponding first power supply part, a maximum size of the first main portion is greater than that of the second main portion, a connection line of two endpoints of the main electrode of the first subpixel farthest from each other in the second direction overlaps with the first main portion.

19 Claims, 9 Drawing Sheets

(56) References Cited

U.S. PATENT DOCUMENTS

| | | | | |
|---|---|---|---|---|
| 10,103,208 | B2 | 10/2018 | Choi et al. | |
| 10,347,188 | B2 | 7/2019 | Moon | |
| 10,431,767 | B2 | 10/2019 | Woo | |
| 10,692,956 | B2 | 6/2020 | Choi et al. | |
| 11,094,904 | B2 | 8/2021 | Kim | |
| 11,145,704 | B2 | 10/2021 | Tang et al. | |
| 11,423,840 | B2 | 8/2022 | Shang et al. | |
| 11,665,935 | B2 | 5/2023 | Tang | |
| 2013/0328853 | A1 | 12/2013 | Hong | |
| 2015/0130691 | A1 | 5/2015 | Jeon | |
| 2016/0226013 | A1 | 8/2016 | Liu et al. | |
| 2016/0247452 | A1 | 8/2016 | Lee et al. | |
| 2018/0062102 | A1 | 3/2018 | Kim | |
| 2018/0122880 | A1 | 5/2018 | Lee et al. | |
| 2018/0159076 | A1* | 6/2018 | Yun | H10K 59/121 |
| 2018/0175121 | A1 | 6/2018 | Ji et al. | |
| 2018/0212016 | A1 | 7/2018 | Choi et al. | |
| 2018/0342571 | A1 | 11/2018 | Kwon et al. | |
| 2019/0011830 | A1 | 1/2019 | Ji | |
| 2019/0157627 | A1 | 5/2019 | Bae et al. | |
| 2019/0326360 | A1 | 10/2019 | Gwon et al. | |
| 2019/0385522 | A1 | 12/2019 | Song et al. | |
| 2020/0185477 | A1 | 6/2020 | Xia | |
| 2020/0328264 | A1 | 10/2020 | Wu et al. | |
| 2021/0118972 | A1 | 4/2021 | Zou et al. | |
| 2021/0159292 | A1 | 5/2021 | Zhang et al. | |
| 2021/0233964 | A1 | 7/2021 | Yan et al. | |
| 2021/0288294 | A1 | 9/2021 | Guo et al. | |
| 2021/0319754 | A1 | 10/2021 | Shang et al. | |
| 2021/0408203 | A1 | 12/2021 | Shi et al. | |
| 2022/0069027 | A1 | 3/2022 | Wang et al. | |
| 2022/0123074 | A1* | 4/2022 | Zhang | G09G 3/3233 |
| 2022/0208890 | A1 | 6/2022 | Liu et al. | |
| 2022/0302244 | A1 | 9/2022 | Yuan et al. | |
| 2022/0415993 | A1* | 12/2022 | Ryu | H10K 59/131 |
| 2023/0024556 | A1 | 1/2023 | Ko et al. | |
| 2023/0247863 | A1* | 8/2023 | Lee | H10K 59/1213 |

FOREIGN PATENT DOCUMENTS

| | | | |
|---|---|---|---|
| CN | 104835832 | A | 8/2015 |
| CN | 105449127 | A | 3/2016 |
| CN | 105895026 | A | 8/2016 |
| CN | 106129061 | A | 11/2016 |
| CN | 106298865 | A | 1/2017 |
| CN | 107180610 | A | 9/2017 |
| CN | 107507570 | A | 12/2017 |
| CN | 107527590 | A | 12/2017 |
| CN | 103489889 | B | 2/2018 |
| CN | 107785398 | A | 3/2018 |
| CN | 107818755 | A | 3/2018 |
| CN | 108022960 | A | 5/2018 |
| CN | 108074961 | A | 5/2018 |
| CN | 108231836 | A | 6/2018 |
| CN | 108695370 | A | 10/2018 |
| CN | 108735779 | A | 11/2018 |
| CN | 108933155 | A | 12/2018 |
| CN | 109037281 | A | 12/2018 |
| CN | 109638020 | A | 4/2019 |
| CN | 109755281 | A | 5/2019 |
| CN | 109873024 | A | 6/2019 |
| CN | 110021654 | A | 7/2019 |
| CN | 110047898 | A | 7/2019 |
| CN | 106991974 | B | 8/2019 |
| CN | 110459556 | A | 11/2019 |
| CN | 110610980 | A | 12/2019 |
| CN | 110619850 | A | 12/2019 |
| CN | 110707134 | A | 1/2020 |
| CN | 110718572 | A | 1/2020 |
| CN | 111029387 | A | 4/2020 |
| CN | 111341815 | A | 6/2020 |
| CN | 111799320 | A | 10/2020 |
| CN | 111987136 | A | 11/2020 |
| CN | 112133731 | A | 12/2020 |
| CN | 112585761 | A | 3/2021 |
| CN | 112673477 | A | 4/2021 |
| CN | 112714954 | A | 4/2021 |
| CN | 112786812 | A | 5/2021 |
| CN | 112820763 | A | 5/2021 |
| CN | 112825345 | A | 5/2021 |
| CN | 112838167 | A | 5/2021 |
| CN | 213212167 | U | 5/2021 |
| CN | 113066833 | A | 7/2021 |
| CN | 113078196 | A | 7/2021 |
| CN | 113196374 | A | 7/2021 |
| CN | 113196493 | A | 7/2021 |
| CN | 113241421 | A | 8/2021 |
| CN | 113257885 | A | 8/2021 |
| CN | 113692649 | A | 11/2021 |
| CN | 113728439 | A | 11/2021 |
| CN | 114242749 | A | 3/2022 |
| EP | 2 693 481 | A2 | 2/2014 |
| EP | 3 151 222 | A1 | 4/2017 |
| EP | 3 293 767 | A2 | 3/2018 |
| EP | 3 321 966 | A1 | 5/2018 |
| EP | 3 407 389 | A1 | 11/2018 |
| EP | 4 068 260 | A1 | 5/2022 |
| EP | 4 006 981 | A1 | 6/2022 |
| EP | 4 006 985 | A1 | 6/2022 |
| WO | 2021/018301 | A1 | 2/2021 |
| WO | 2021189304 | A1 | 9/2021 |

* cited by examiner

DISPLAY SUBSTRATE WITH OVERLAPPED MAIN ELECTRODE AND POWER SUPPLY SIGNAL LINE, AND DISPLAY DEVICE

This application is the National Stage of International Application No. PCT/CN2022/096339, filed May 31, 2022, which is hereby incorporated by reference in their entirety.

TECHNICAL FIELD

At least one embodiment of the present disclosure relates to a display substrate and a display device.

BACKGROUND

At present, the active matrix organic light-emitting diode (AMOLED) flexible screen technology is becoming more and more mature, which has the characteristics of bendability, high contrast, and low power consumption and thus has good development prospects. With the continuous development of display technology, optimizing the display effect has become an inevitable trend. In order to improve the performance of the display device, some display products reduce the chromatic aberration by optimizing the arrangement between the conductive structure and the light-emitting element in the pixel.

SUMMARY

At least one embodiment of the disclosure provides a display substrate and a display device.

Embodiments of the disclosure provides a display substrate, comprising: a base substrate; a plurality of subpixels on the base substrate, each of at least some of the subpixels comprising a light-emitting element and a pixel circuit, the light-emitting element comprising a light-emitting functional layer and a first electrode and a second electrode provided on two sides of the light-emitting functional layer in a direction perpendicular to the base substrate, the first electrode being provided between the light-emitting functional layer and the base substrate, the light-emitting element being at least partially provided in a light-emitting region, and the first electrode of the light-emitting element comprising a main electrode overlapping with the light-emitting region; a plurality of power supply signal lines, at least some of the plurality of power supply signal lines extending in the first direction and arranged in a second direction, the plurality of power supply signal lines being provided between the base substrate and the first electrode of the light-emitting element, the first direction intersects the second direction. The at least some of the subpixels comprise a plurality of first subpixels, at least one power supply signal line comprises a first power supply part overlapping with the main electrode of at least one of the plurality of first subpixels in a third direction perpendicular to the base substrate, the first power supply part includes a first main portion and a second main portion. In the second direction, a maximum size of the main electrode of the first subpixel is not smaller than a maximum size of its corresponding first power supply part, a maximum size of the first main portion is greater than a maximum size of the second main portion in the first power supply part, a connection line of two endpoints of the main electrode of the first subpixel farthest from each other in the second direction is an endpoint connection line, and the endpoint connection line overlaps with the first main portion in the third direction.

For example, according to embodiments of the disclosure, the plurality of power supply signal lines include a first power supply signal line and a second power supply signal line, a maximum size of the first power supply signal line and a maximum size of the second power supply signal line in the second direction are a first size and a second size, respectively, and the second size is smaller than the first size.

For example, according to embodiments of the disclosure, the plurality of first subpixels comprise at least one first type subpixel, the first power supply part overlapping with the main electrode of the first type subpixel is a first type power supply part, and the first main portion of the first type power supply part is an asymmetric structure.

For example, according to embodiments of the disclosure, the first main portion of the first type power supply part comprises a first protrusion, and the first protrusion is provided on a side of a first symmetric centerline, extending in the first direction, of the second main portion.

For example, according to embodiments of the disclosure, an extension direction of a symmetric centerline of the portion of the first type power supply part except for the first protrusion intersects with an extension direction of a second symmetric centerline of the main electrode of the first type subpixel.

For example, according to embodiments of the disclosure, the plurality of first subpixels further comprise at least one second type subpixel, and the first power supply part overlapping with the main electrode of the second type subpixel is a second type power supply part, the second type power supply part comprises a third symmetric centerline extending in the first direction, the main electrode of the second type subpixel comprises a fourth symmetric centerline extending in the first direction, the third symmetric centerline of the second type power supply part in a same column of power supply signal line and the fourth symmetric centerline of the second type subpixel overlapping with the second type power supply part are provided in a same plane perpendicular to the base substrate.

For example, according to embodiments of the disclosure, the main electrode of the first subpixel comprises a first corner and a second corner opposite to each other, and a third corner and a fourth corner opposite to each other, an orthographic projection of at least one of the first corner and the second corner on the base substrate at least partially overlaps with an orthographic projection of the first symmetric centerline on the base substrate, and an orthographic projection of the fourth corner on the base substrate and an orthographic projection of the first protrusion on the base substrate at least partially overlap with each other.

For example, according to embodiments of the disclosure, the first main portion of the second type power supply part comprises a second protrusion and a third protrusion, and the second protrusion and the third protrusion are symmetrically distributed relative to the third symmetric centerline, the main electrode of the second type subpixel comprises a first corner and a second corner opposite to each other, and a third corner and a fourth corner opposite to each other, an orthographic projection of the second protrusion on the base substrate at least partially overlaps with an orthographic projection of one of the first corner and the second corner on the base substrate, and an orthographic projection of the third protrusion on the base substrate at least partially overlaps with the orthographic projection of the other of the first corner and the second corner on the base substrate.

For example, according to embodiments of the disclosure, in the third direction, the light-emitting region of the second type subpixel overlaps with at least one of the second protrusion and the third protrusion.

For example, according to embodiments of the disclosure, in the second direction, a maximum size of the first main portion of the second type power supply part is greater than a maximum size of the first main portion of the first type power supply part, and a ratio of a maximum size of the second main portion of the first type power supply part to a maximum size of the second main portion of the second type power supply part is 0.9~1.1.

For example, according to embodiments of the disclosure, a maximum size of the first main portion of the second type power supply part in the second direction is 1.1-2 times a maximum size of the second main portion of the second type power supply part in the second direction.

For example, according to embodiments of the disclosure, each of the adjacent plurality of power supply signal lines comprises a plurality of power supply parts arranged in the first direction, and a first connection portion is provided between and electrically connected with adjacent two power supply parts, and the plurality of the power supply parts include the first power supply part, a ratio of a maximum size of the power supply part in the second direction to a maximum size of the first connection portion in the second direction is 1.5-5.

For example, according to embodiments of the disclosure, the first type power supply part includes a first subtype power supply part and a second subtype power supply part, the second main portion of the first type power supply part comprises a first side and a second side opposite to each other in the second direction, the first protrusion of the first subtype power supply part is disposed on the first side of the second main portion, and the first protrusion of the second subtype power supply part is disposed on the second side of the second main portion.

For example, according to embodiments of the disclosure, the main electrode of the first subpixel comprises a plurality of corners, the plurality of corners include the first corner, the second corner, the third corner and the fourth corner, edges or their extension lines of the main electrode are connected in turn into a polygon, and each of a plurality of vertex angles of the polygon has a region that does not overlap with the corresponding corner of the main electrode, a non-overlapping region of the third corner and the corresponding vertex angle of the polygon is greater than a non-overlapping region of each of at least some of other corners and the corresponding vertex angle of the polygon.

For example, according to embodiments of the disclosure, the at least some of the subpixels further comprise a plurality of second subpixels, in the third direction, the at least one power supply signal line comprises a second power supply part overlapping with the main electrode of at least one of the plurality of second subpixels, the second power supply part comprises a fifth symmetric centerline extending in the first direction, the main electrode of the second subpixel comprises a sixth symmetric centerline extending in the first direction, the fifth symmetric centerline of the second power supply part in a same column of power supply signal line and the sixth symmetric centerline of the second subpixel overlapping with the second power supply part are provided in a same plane perpendicular to the base substrate.

For example, according to embodiments of the disclosure, an orthographic projection of the main electrode of the second subpixel on the base substrate and an orthographic projection of the second power supply part on the base substrate overlap with each other, with an overlapping region being at least 90% of an orthographic projection area of the main electrode of the second subpixel on the base substrate.

For example, according to embodiments of the disclosure, in the second direction, a maximum size of the second power supply part is smaller than a maximum size of the first main portion of the first power supply part, and a ratio of the maximum size of the second power supply part and a maximum size of the second main portion of the first power supply part is 0.9~1.1.

For example, according to embodiments of the disclosure, the display substrate further comprises a plurality of data lines, extending in the first direction and arranged in the second direction, the plurality of data lines and the plurality of power supply signal lines being provided in a same layer; the data lines provided between adjacent two power supply signal lines comprise a first data line and a second data line arranged in the second direction, the first data line and the second data line are symmetrically distributed relative to a seventh symmetric centerline between the first data line and the second data line; the at least some of the subpixels further comprises a plurality of third subpixels, the main electrode of the light-emitting element of at least one of the plurality of third subpixels at least partially overlaps with the data line, and an overlapping region of the main electrode of the third subpixel and the data line is substantially symmetrical relative to the seventh symmetric centerline.

For example, according to embodiments of the disclosure, the display substrate further comprises a plurality of second connection portions disposed in a same layer as at least some of the plurality of power supply signal lines, each second connection portion comprising a first connector and a second connector; the plurality of second connection portions are arranged in an array in the first direction and the second direction to form a plurality of second-connection-portion rows and a plurality of second-connection-portion columns; the power supply signal line comprises a plurality of power supply parts arranged in the first direction, a first connection portion is provided between and electrically connected to adjacent two power supply parts, and the power supply parts of the plurality of power supply signal lines are arranged in an array in the first direction and the second direction to form a plurality of power-supply-part rows and a plurality of power-supply-part columns; the plurality of the second-connection-portion rows and the plurality of the power-supply-part rows are alternately arranged in the first direction, and two adjacent second connection portions in a same second-connection-portion row are arranged on two sides of the data line, respectively.

For example, according to embodiments of the disclosure, the connection electrode of the light-emitting element and the first connection portion are substantially not overlapped with each other; in the first direction, a maximum size of the main electrode of the first subpixel is not smaller than a maximum size of the first main portion of the corresponding first power supply part.

For example, according to embodiments of the disclosure, the first connector is electrically connected to the connection electrode of the first subpixel or the connection electrode of the second subpixel, and the second connector is electrically connected to the connection electrode of the third subpixel.

For example, according to embodiments of the disclosure, the first connection portion comprises at least one hollow-out portion, and an area of the hollow-out portion is ¼-⅓ of an area of the first connection portion.

The embodiments of the disclosure provide a display device, comprising the display substrate as described above.

BRIEF DESCRIPTION OF DRAWINGS

In order to clearly illustrate the technical solution of the embodiments of the disclosure, the drawings of the embodiments will be briefly described in the following; it is apparent that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects.

The terms, such as "vertical", "parallel" and "same" and the like, as used in the embodiments of the present disclosure include features such as "vertical", "parallel" and "same" in the strict sense, and also include features such as "substantially vertical", "substantially parallel" "substantially same" containing certain errors, so that these terms allow an deviation range of a certain value which is acceptable by those of ordinary skill in the art by taking into account the measurement and the error associated with the measurement of a certain quantity (i.e., taking into account the limitation of the measurement system). The term "center" as used in the embodiments of the present disclosure includes a location strictly located in the center of the geometry and also includes a position located in a substantially central area around the center of geometry. For example, the term "substantially/approximately" means to be within one or more standard deviations of the value, or within 10% or 5% of the value.

The performance specifications of organic light-emitting diode display products include power consumption, brightness, chromatic aberration, etc. Factors of components, capable of affecting the chromatic aberration, of organic light-emitting diode display products include the flatness of the anode. The optimizing design for the flatness of the anode in the light-emitting element can prevent the deviation of the outgoing light of the light-emitting element, thereby reducing the chromatic aberration and other phenomena of the display product.

Figure 1A:
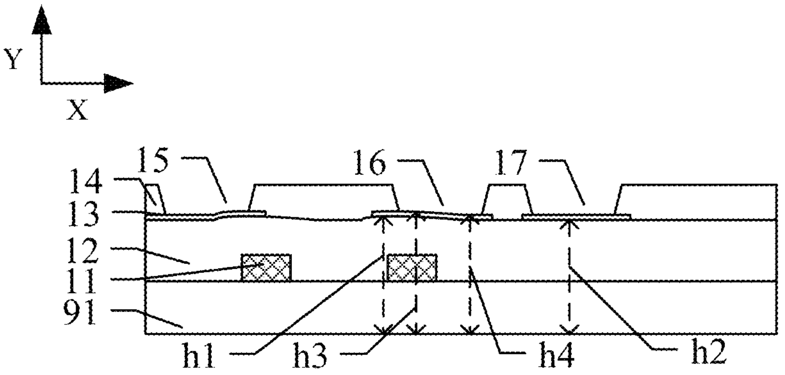
FIG. 1A is a schematic view of a local cross-sectional structure of a display substrate.

FIG. 1A is a schematic view showing a local cross-sectional structure of a display substrate. As shown in FIG. 1A, the display substrate includes a layer 91; the layer 91 for example includes a base substrate, an active semiconductor layer provided on the base substrate, and at least one connection layer provided on the side of the active semiconductor layer facing away from the base substrate. The display substrate further comprises a conductive layer 11 provided on the layer 91, for example, the conductive layer 11 includes a data line, a power supply signal line and the like. The display substrate further comprises a planarization layer 12 provided on the side of the conductive layer 11 facing away from the layer 91, an anode 13 provided on the side of the planarization layer 12 facing away from the conductive layer 11, and a pixel definition layer 14 provided on the side of the anode 13 facing away from the planarization layer 12. The pixel definition layer 14 includes a plurality of openings 15-17 for defining the light-emitting region of the subpixels. Each of the plurality of openings 15-17 expose a part of the anode 13; when the subsequent organic light-emitting layer is formed in the openings 15-17 of the above pixel definition layer 14, the organic light-emitting layer is in contact with the anode 13, so that the anode 13 drives the organic light-emitting layer to emit light.

For example, in the display substrate, the arrangement of the conductive layer 11 has a large effect on the light output effect of the light-emitting element, for example, the conductive layer 11 may destroy the flatness of the anode of the light-emitting element, and then cause the chromatic aberration of the light-emitting element.

As shown in FIG. 1A, the thickness of the conductive layer 11 is relatively large, for example, the thickness is 0.6-0.9 μm, resulting in the surface, facing the anode 13, of the planarization layer 12 provided on the conductive layer 11 to be uneven. For example, the distance between the surface, facing away from the layer 91, of a portion of the planarization layer 12 directly above the conductive layer 11 (e.g., a data line, a power supply signal line and a pattern of the same material in the same layer) and the surface of the layer 91 facing away from the planarization layer 12 is h1, and the distance between the surface, facing away from the layer 91, of a portion of the planarization layer 12 directly above the area not provided with the conductive layer 11 and the surface of the layer 91 facing away from the planarization layer 12 is h2, h1>h2.

As shown in FIG. 1A, in the opening 16, a portion of the planarization layer 12 is overlapped with the conductive layer 11, and the other portion of the planarization layer 12 is not overlapped with the conductive layer 11, whereby the surface, facing the anode 13, of the planarization layer 12 in the opening 16 is not flat, resulting in a surface of the anode 13 provided on the planarization layer 12 to be not flat. For example, for the anode 13 provided in the opening 16, the distance between the surface, facing away from the layer 91, of a portion of the anode 13 provided directly above the conductive layer 11 and the surface of the layer 91 facing away from the anode 13 is h3, the distance between the surface, facing away from the layer 91, of a portion of the anode 13 directly above the area not provided with the conductive layer 11 and the surface of the layer 91 facing away from the anode 13 is h4, h3>h4. In this way, the anode 13 within the opening 16 is "inclined". Similarly, the anode 13 in the opening 15 also occurs "inclination"; and due to the position of the conductive layer 11, the "inclination direction" of the anode 13 in the opening 15 is different from the "inclination direction" of the anode 13 in the opening 16, resulting in inconsistent intensities of light emitted by the subpixels respectively corresponding to the opening 15 and the opening 16 in respective directions. For example, the arrow of the X direction points to the right, the intensities of light emitted by the light-emitting regions defined by the opening 15 and opening 16 are inconsistent in the left direction and the right direction. No conductive layer 11 is provided directly below the anode 13 provided in the opening 17, so the surface of the anode 13 in the opening 17 is basically flat, no "inclination" occurs, and the intensities of light emitted by the light-emitting region defined by the opening 17 are consistent in respective directions. For the light-emitting regions of adjacent three subpixels of different colors defined by the openings 15-17, the anode 13 in the opening 15 is "inclined" to the left, the anode 13 in the opening 16 is "inclined" to the right, and the anode 13 in the opening 17 is not inclined, thus the "inclining" states of the anodes 13 of subpixels of different colors are different, resulting in a mismatch in the intensities of light emitted by the light-emitting regions of the three subpixels in the left direction and the right direction. A display device using such a display substrate will have a large viewing bias, and when the display device is viewed by human eyes, a chromatic aberration similar to redness on one side and blue on the other side occurs.

Figure 1B:
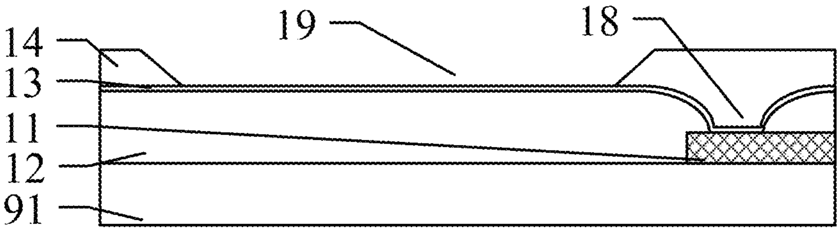
FIG. 1B is a schematic view of a local cross-sectional structure of another display substrate.

FIG. 1B is another schematic view showing a local cross-sectional structure of the display substrate. The display substrate shown in FIG. 1B includes the layer 91, the conductive layer 11, the planarization layer 12, the anode 13, and the pixel definition layer 14 shown in FIG. 1A. As shown in FIG. 1B, the planarization layer 12 in the display substrate includes a via 18 so that the anode 13 is electrically connected to the conductive layer 11. The pixel definition layer 14 includes an opening 19 to expose part of the anode 13, and when the subsequent organic light-emitting layer is formed in the opening 19, the organic light-emitting layer is in contact with the anode 13 to form the light-emitting region.

As shown in FIG. 1B, the via 18 is provided outside the light-emitting region; because the anode 13 provided around the via 18 is inclined, a certain distance should be provided between the light-emitting region and the via 18 to ensure the flatness of the anode 13 in the light-emitting region, so as to avoid the chromatic aberration of the display substrate.

Referring to FIGS. 1A-1B, the position relationship between the conductive layer 11 and the anode 13, and the position relationship between the via 18 in the planarization layer 12 and the anode 13 both affects the flatness of the anode 13 in the light-emitting region, resulting in the display substrate prone to have a chromatic aberration.

Figure 2A:
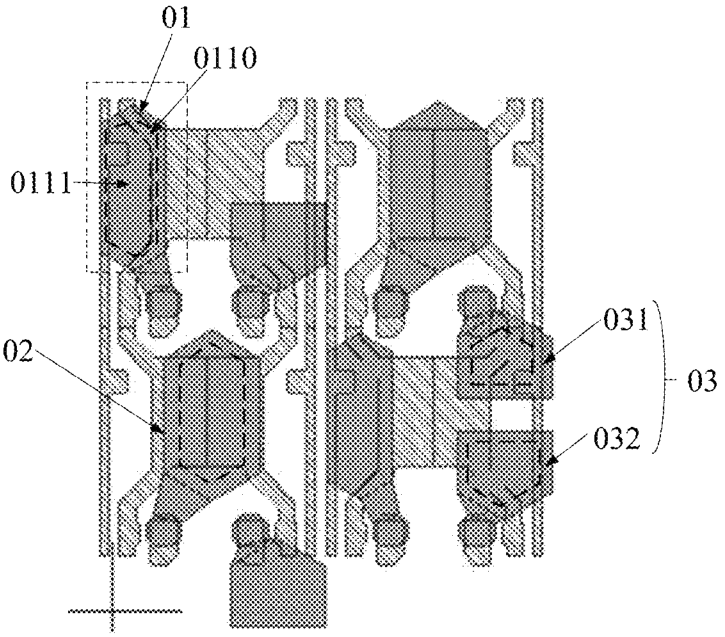
FIG. 2A is a schematic view showing the overlapping relationship between the pixel arrangement and the conductive layer in a display substrate.
Figure 2B:
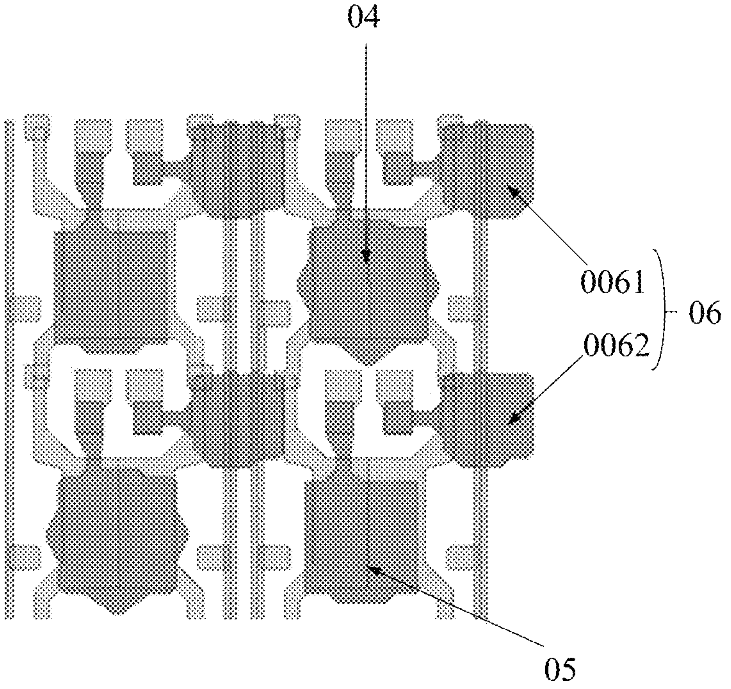
FIG. 2B is a schematic view showing the overlapping relationship between the pixel arrangement and the conductive layer in another display substrate.

FIG. 2A is a schematic view showing the overlapping relationship between the pixel arrangement and the conductive layer in a display substrate; FIG. 2B is a schematic view showing the overlapping relationship between the pixel arrangement and the conductive layer in another display substrate; FIG. 2C is a schematic view of the overlapping relationship of a subpixel and the conductive layer in a display substrate.

For clarity, FIGS. 2A and 2B show the overlapping relationship between the anode of the light-emitting element in the pixel circuit and the conductive layer connected to it. Referring to FIGS. 2A and 2B, the conductive layer comprises a plurality of conductive parts, and the anode of the light-emitting element overlaps with at least partially with the conductive part of the conductive layer in the direction perpendicular to the base substrate of the display substrate. The display substrate includes a plurality of subpixels, such as a blue subpixel 01 configured to emit blue light, a red subpixel 02 configured to emit red light, and a green subpixel 03 configured to emit green light; the green subpixel 03 configured to emit green light includes a first green subpixel 031 and a second green subpixel 032. The light-emitting element of each subpixel includes a light-emitting region, for example, the light-emitting region is defined by the opening in the pixel definition layer.

As shown in FIG. 2A, the light-emitting region corresponding to each subpixel refers to the range shown by the dashed line. For the blue subpixel 01 configured to emit blue light, the light-emitting region comprises an overlapping region 0110 and a non-overlapping region 0111, and the area of the non-overlapping region 0111 is greater than the area of the overlapping region 0110; combined with the display substrate in FIG. 1A, the distance between the surface, facing away from the base substrate (not shown in the drawings), of a portion of the anode rightly above the conductive layer and the surface of the base substrate facing away from the anode in the overlapping region 0110 corresponds to h3, and the distance between the surface, facing away from the base substrate, of a portion of the anode provided directly above the region not provided with the conductive layer and the surface of the base substrate facing away from the anode in the non-overlapping region 0111 corresponds to h4, h3>h4. As a result, the anode 13 in the light-emitting region of the blue subpixel 01 is "inclined". At the same time, the distribution of the non-overlapping region 0111 is not symmetrical relative to the overlapping region 0110.

For example, in some embodiments of the present disclosure, in the case that the non-overlapping region in the light-emitting region is symmetrically distributed relative to the overlapping region, the anode in the light-emitting region occurs "symmetrical inclination", that is, in the light-emitting region, the inclination directions of the light caused by the non-overlapping region and the overlapping region are symmetrical. In this case, compared to the "inclination only to one side" in FIG. 2A caused by the asymmetric arrangement of non-overlapping region 0111 and overlapping region 0110, the chromatic aberration of subpixels is weakened when the non-overlapping region is symmetrically distributed relative to the overlapping region.

As shown in FIG. 2B, the display substrate comprises a plurality of subpixels, such as a blue subpixel 04 configured to emit blue light, a red subpixel 05 configured to emit red light, and a green subpixel 06 configured to emit green light; the green subpixel 06 configured to emit green light comprises a first green subpixel 0061 and a second green subpixel 0062. Compared with FIG. 2A, the conductive layer overlapping with the anode in the light-emitting region of subpixel 04 and subpixel 05 in FIG. 2B has a better flatness. The non-overlapping region of the anode and the conductive layer in the light-emitting region of subpixel 0062 or subpixel 0061 has a certain symmetry relative to the overlapping region. As a result, the chromatic aberration of the display substrate in FIG. 2B is relatively weak.

In this way, in the pixel circuit, the conductive layer overlapping with the anode in the light-emitting region of the light-emitting element of the subpixel needs to ensure a certain flatness to prevent the anode in the light-emitting region of the subpixel from being "inclined". At the same time, when the non-overlapping region is generated due to the actual patterning requirements, the symmetry state of the non-overlapping region relative to the overlapping region also affects the luminescence effect.

The embodiments of the present disclosure provide a display substrate and a display device. The display substrate includes a base substrate, a plurality of subpixels, and a plurality of power supply signal lines. The plurality of subpixels are provided on the base substrate, each of at least some of the subpixels comprises a light-emitting element and a pixel circuit, the light-emitting element comprises a light-emitting functional layer and a first electrode and a second electrode provided respectively on two sides of the light-emitting functional layer in the direction perpendicular to the base substrate, the first electrode is provided between the light-emitting functional layer and the base substrate, the light-emitting element is at least partially provided in a light-emitting region, and the first electrode of the light-emitting element includes a main electrode overlapping with the light-emitting region; at least some of the plurality of power supply signal lines extend in a first direction and are arranged in a second direction, the plurality of power supply signal lines are provided between the base substrate and the first electrode of the light-emitting element, the first direction intersects the second direction; the at least some of the subpixels comprise a plurality of first subpixels, at least one power supply signal line comprises a first power supply part overlapping with the main electrode of at least one of the plurality of first subpixels along a third direction perpendicular to the base substrate, the first power supply part comprises a first main portion and a second main portion; in the second direction, the maximum size of the main electrode of the first subpixel is not smaller than the maximum size of its corresponding first power supply part, the maximum size of the first main portion is greater than the maximum size of the second main portion in the first power supply part, a connection line of two endpoints of the main electrode of the first subpixel farthest from each other in the second direction is an endpoint connection line, and the endpoint connection line overlaps with the first main portion in the third direction. The embodiments of the present disclosure design the matching form of the pixel circuit and the light-emitting element, which is conducive to improving the flatness of the part of the conductive layer overlapping with the light-emitting element, and reducing the probability of chromatic aberration and other phenomena in the display products.

The display substrate and display device provided in the embodiments of the present disclosure are described below in conjunction with the accompanying drawings.

Figure 3:
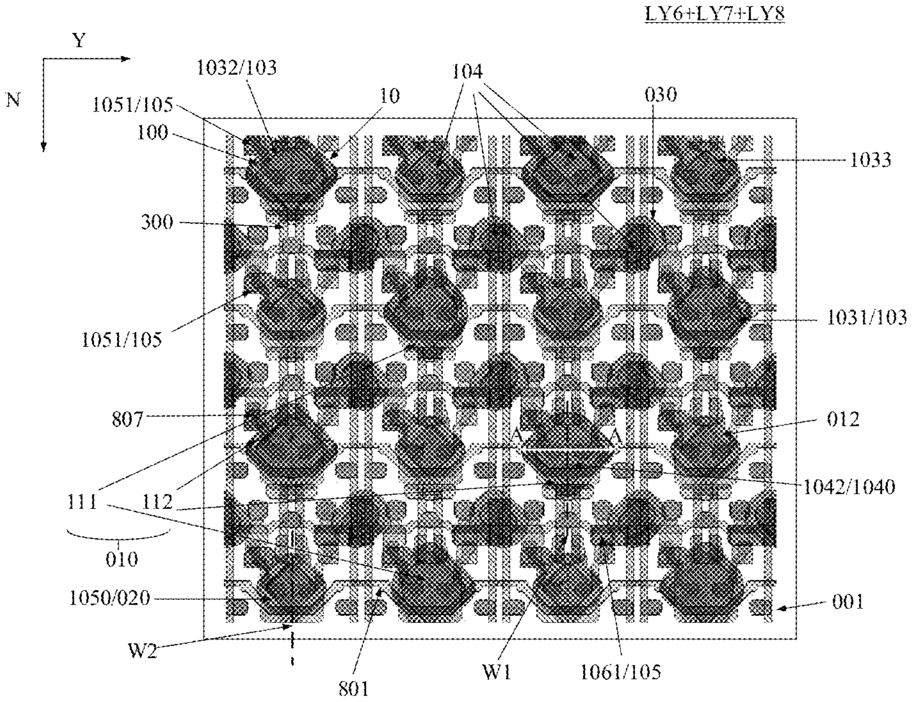
FIG. 3 is a schematic view of the pixel arrangement of a display substrate provided by embodiments of the present disclosure.
Figure 4:
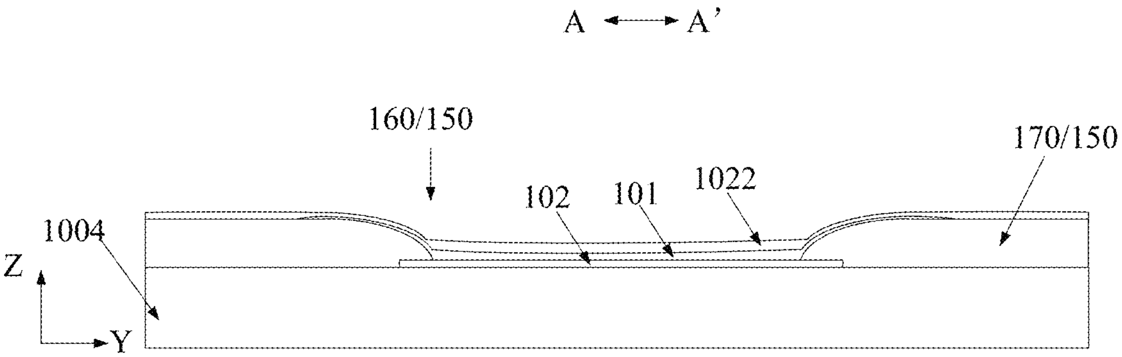
FIG. 4 is a schematic view of the local cross-sectional structure taken along the AA' line shown in FIG. 3.
Figure 5:
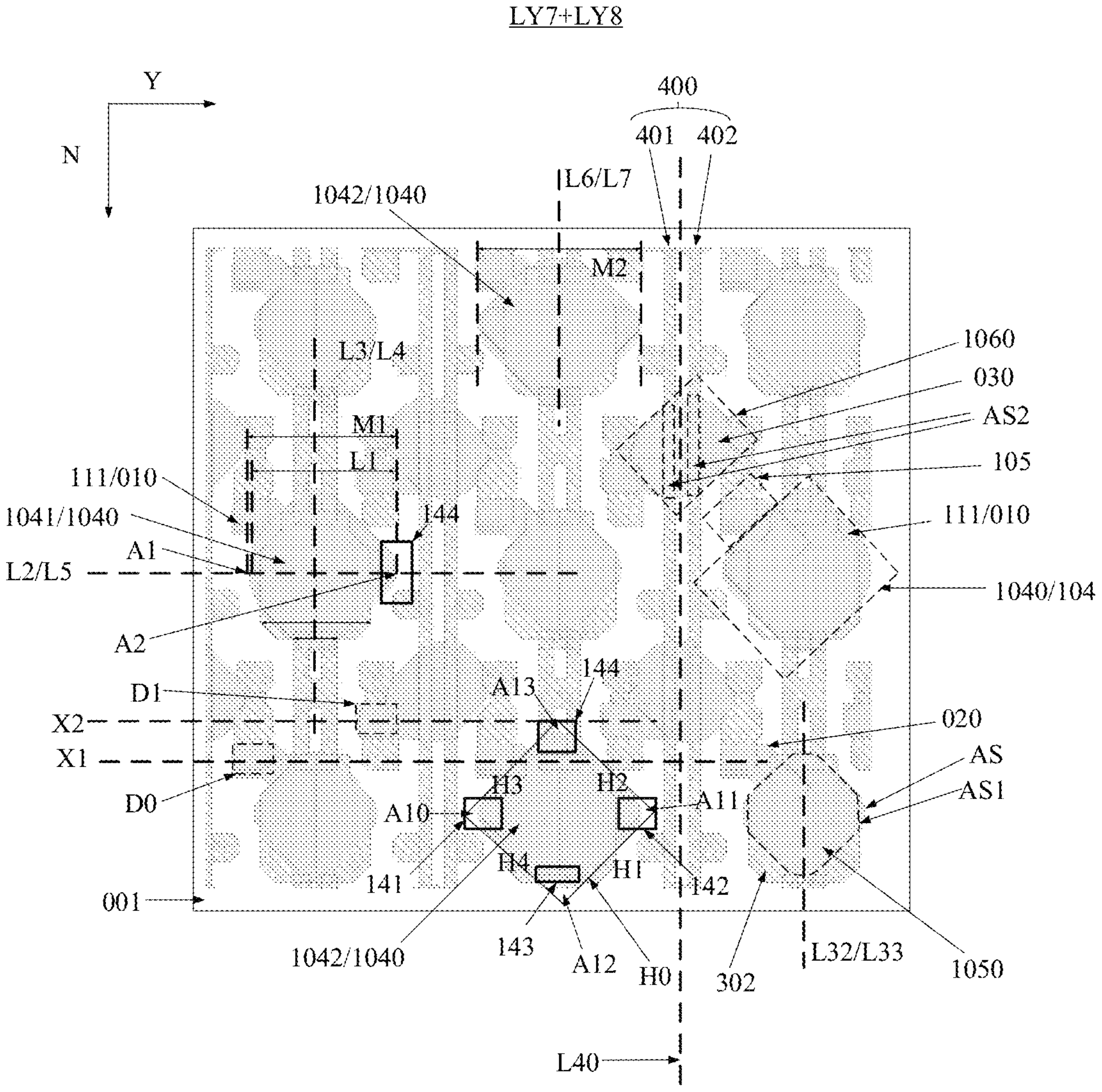
FIG. 5 is a schematic view of a stack structure of a second conductive layer and a first electrode of a light-emitting element in the display substrate provided by the embodiments of the present disclosure.
Figure 6:
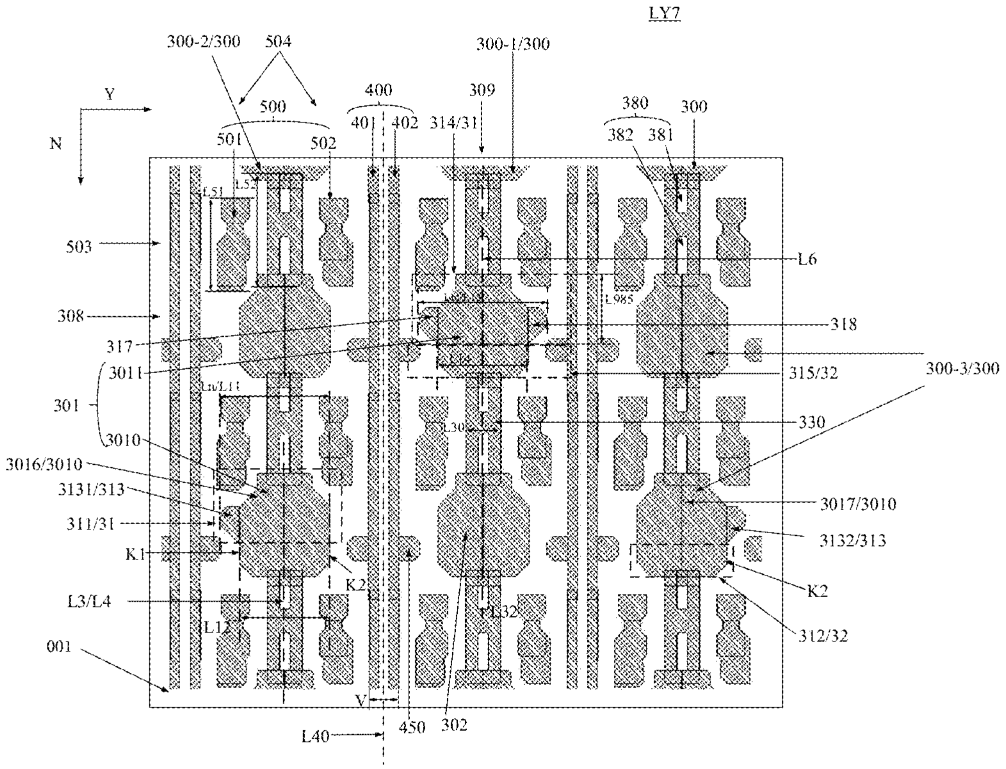
FIG. 6 is a schematic view of a local structure of the second conductive layer in the display substrate provided by the embodiments of the present disclosure.
Figure 7:
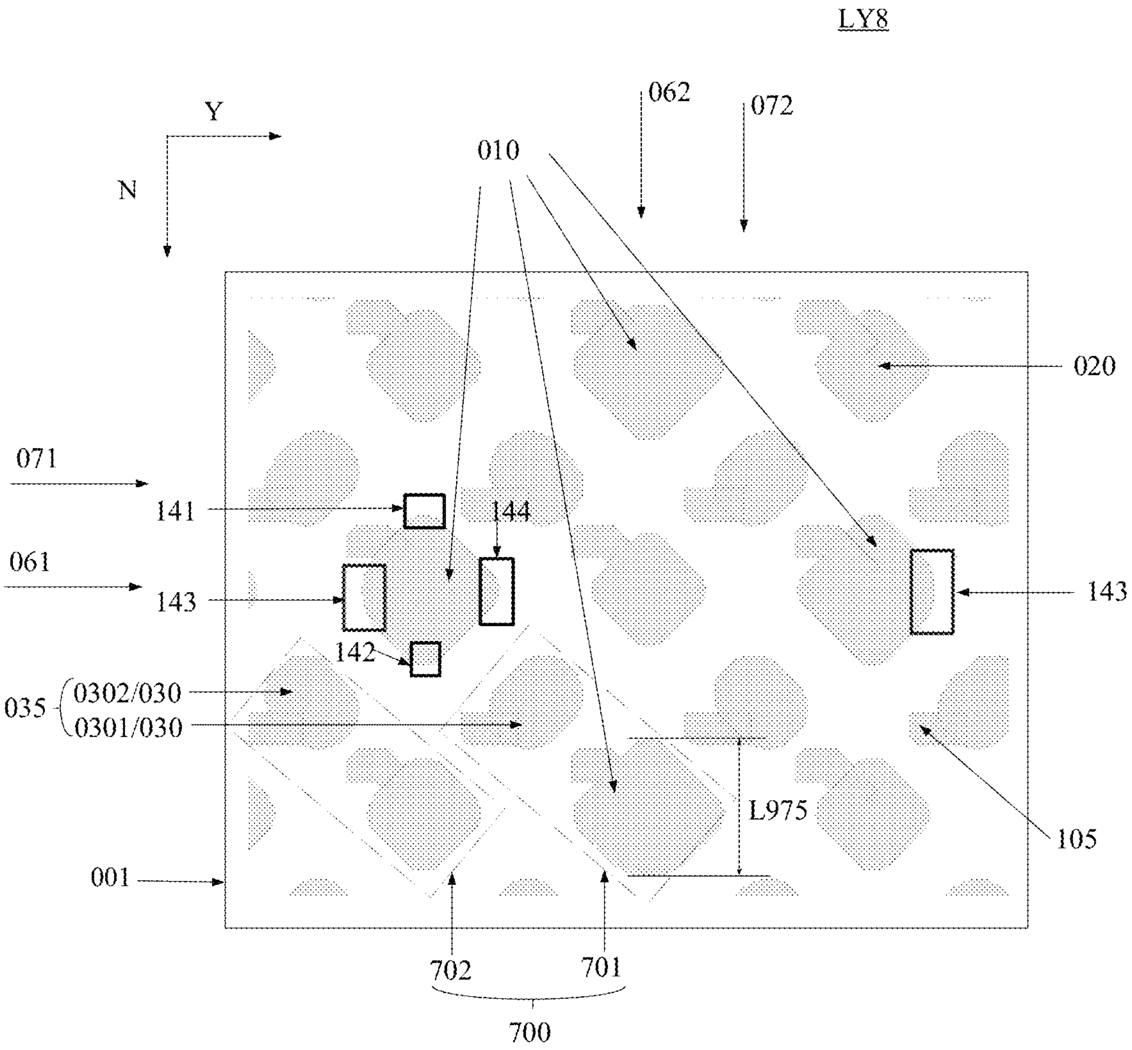
FIG. 7 is a schematic view of a local structure of the first electrode of the light-emitting element of the display substrate provided by the embodiments of the present disclosure.

FIG. 3 is a schematic view of a pixel arrangement structure of the display substrate provided by the embodiments of the present disclosure; FIG. 4 is a schematic view of a local cross-sectional structure taken along the AA' line in FIG. 3; FIG. 5 is a schematic view of the stack structure of a second conductive layer and a first electrode of a light-emitting element in the display substrate provided by the embodiments of the present disclosure; FIG. 6 is schematic view of a local structure of the second conductive layer of the display substrate provided by the embodiments of the present disclosure; FIG. 7 is a schematic view of a local structure of the first electrode of the light-emitting element in the display substrate provided by the embodiments of the present disclosure.

Figure 8:
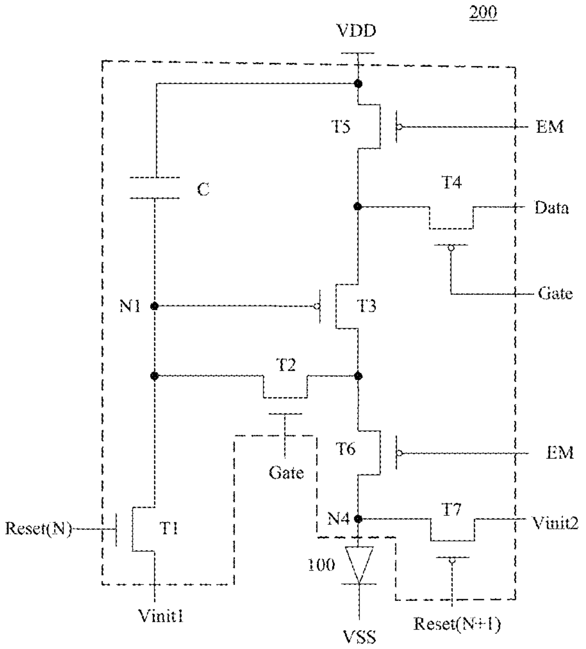
FIG. 8 is an equivalent diagram of a pixel circuit provided by the embodiments of the present disclosure.

Referring to FIGS. 3 and 4, the display substrate comprises a base substrate 001 and a plurality of subpixels 10, the plurality of subpixels 10 are provided on the base substrate 001, each of at least some of the subpixels 10 includes a light-emitting element 100 and a pixel circuit 200 (see FIG. 8). For example, the pixel circuit 200 is configured to drive the light-emitting element 100 to emit light. The light-emitting element 100 includes a light-emitting functional layer 101, and a first electrode 102 and a second electrode 1022 provided respectively on two sides of the light-emitting functional layer 101 in the direction Z perpendicular to the base substrate 001, the first electrode 102 is provided between the light-emitting functional layer 101 and the base substrate 001.

Referring to FIGS. 3 and 4, a structural layer 1004 is provided on a side of the first electrode 102 of the light-emitting element 100 facing away from the second electrode 1022, the structural layer 1004 includes, for example, the base substrate, an active semiconductor pattern layer, a gate line layer, a data line layer, and a plurality of insulation layers, etc. The display substrate further comprises a pixel definition pattern 150, the pixel definition pattern 150 is provided on the side of the first electrode 102 of the light-emitting element 100 facing away from the base substrate 001, and the pixel definition pattern 150 includes openings 160 and definition portions 170 around the openings 160, and the plurality of light-emitting elements 100 are at least partially provided in the plurality of openings 160.

For example, the definition portion 170 defines the size of the opening 160. For example, the material of the definition portion 170 includes polyimide, acrylic or polyethylene terephthalate, etc.

Referring to FIGS. 3 and 4, the pixel circuit 200 includes a light-emitting control transistor T6 (see FIG. 8), the first electrode 102 of the light-emitting element 100 is electrically connected with the light-emitting control transistor T6.

For example, the light-emitting element 100 is at least partially provided in a light-emitting region 103, and the first electrode 102 of the light-emitting element 100 includes a main electrode 104 overlapping with the light-emitting region 103. The portion of the light-emitting element 100 provided in the opening 160 is the light-emitting region 103, the orthographic projection of the light-emitting region 103 on the base substrate 001 is within the orthographic projection of the first electrode 102 on the base substrate. For example, the main electrode 104 is the portion of the first electrode 102 except for a connection electrode (see descriptions below). In some embodiments of the present disclosure, in addition to the connection electrode and the main electrode, the first electrode 102 further comprises a protrusion electrode (not shown in the drawings), for example, the protrusion electrode is protruded relative to the main electrode of the first electrode 102. For example, the protrusion electrode is configured to block a portion of the structure in the pixel circuit 200. For example, the protrusion electrode is configured to form a capacitance with some conductive structures in the pixel circuit 200.

For example, the shape of the main electrode 104 is the same shape as the opening 160 of the pixel definition pattern 150. For example, the shape of the main electrode 104 differs from the shape of the opening 160 of the pixel definition pattern 150, and the embodiments of the present disclosure are not limited thereto. For example, the main electrode 104 is polygonal. For example, the corner of the main electrode 104 shaped in polygon is a chamfer. For example, the boundary of the main electrode 104 is formed by connecting ends of the protrusion electrode with a smooth transition between the edges of the protrusion electrode in the first electrode 102. For example, the first electrode 102 may include a plurality of protrusion electrodes.

For example, the opening 160 of the pixel definition pattern 150 is configured to define the light-emitting region 103 of the light-emitting element 100. For example, the light-emitting elements 100 of the plurality of subpixels 10 are provided in one-to-one correspondence with the plurality of openings 160. For example, the light-emitting element 100 includes a portion provided in the opening 160, and a portion that overlaps with the definition portion 170 in the direction perpendicular to the base substrate 001. For example, the orthographic projection area of the light-emitting element 100 on the base substrate 001 is greater than the orthographic projection area of the opening 160 on the base substrate 001.

For example, the opening 160 of the pixel definition pattern 150 is configured to expose the first electrode 102 of the light-emitting element 100, and the exposed portion of the first electrode 102 is at least partially in contact with the light-emitting functional layer 101 of the light-emitting element 100. For example, at least part of the first electrode 102 is provided between the definition portion 170 and the base substrate 001. For example, when the light-emitting functional layer 101 is provided in the opening 160 of the pixel definition pattern 150, the first electrode 102 and the second electrode 1022 provided respectively on two sides of the light-emitting functional layer 101 are capable of driving the light-emitting functional layer 101 in the opening 160 of the pixel definition pattern 150 to emit light.

For example, the first electrode 102 is an anode, and the second electrode 1022 is a cathode. For example, the cathode is made of materials with high conductivity and low work function, for example, the cathode is made of metallic materials. For example, the anode is formed of a conductive material with a high work function.

For example, the light-emitting region 103 is the effective light-emitting region of the light-emitting element 100, the shape of the light-emitting region 103 refers to a two-dimensional shape, for example, the shape of the light-emitting region 103 is the same as the shape of the opening 160 of the pixel definition pattern 150. For example, the opening 160 of the pixel definition pattern 150 is of a shape with a small size at one side near the base substrate 001 and a large size at the other side facing away from the base substrate 001. For example, the shape of the light-emitting region 103 is approximately the same size and shape as the side of the opening 160 of the pixel definition pattern 150 near the base substrate 001.

Referring to FIG. 3, FIG. 4 and FIG. 6, the display substrate further comprises a plurality of power supply signal lines 300, at least some of the plurality of power supply signal lines 300 extend along the first direction N and are arranged along the second direction Y, the plurality of power supply signal lines 300 are provided between the base substrate 001 and the first electrodes 102 of the light-emitting elements 100, the first direction N and the second direction Y intersect with each other. For example, the first direction N is perpendicular to the second direction Y.

For example, the pixel circuit 200 further comprises a light-emitting control transistor T5 (as shown in FIG. 8), and the light-emitting control transistor T5 is electrically connected to the power supply signal line 300. For example, the plurality of power supply signal lines 300 are disposed in the same conductive layer, and configured to provide power signals to the pixel circuits.

Referring to FIGS. 3-6, at least some of the subpixels 10 include a plurality of first subpixels 010, at least one power supply signal line 300 includes a first power supply part 301 overlapping with the main electrode 1040 of at least one of the plurality of first subpixel 010 along the third direction Z perpendicular to the base substrate 001.

For example, as shown in FIG. 3, the first subpixel 010 is a blue subpixel configured to emit blue light. The first subpixel 010 may include different types of first subpixels, and the various first subpixels 010 shown in FIG. 3 for example include four different arrangement types. In some embodiments of the present disclosure, a variety of arrangement types may also be adopted according to the design requirements of the actual layout, and the embodiments of the present disclosure are not limited thereto.

For example, referring to FIGS. 3-5, the main electrode 1040 in the first subpixel 010 is disposed on the side of the first power supply part 301 facing away from the base substrate 001; and as for each main electrode 1040, the first power supply part 301 and the main electrode 1040 at least partially overlap with each other.

Referring to FIGS. 3-6, each first power supply part 301 includes a first main portion 31 and a second main portion 32; in the second direction Y, the maximum size M1 of the main electrode 1040 of the first subpixel 010 is not smaller than the maximum size L1 (shown as FIG. 5) of its corresponding first power supply part 301, and the maximum size L11 of the first main portion 301 is greater than the maximum size L12 (shown as FIG. 6) of the second main portion 32 in the first power supply part 301. For example, the first power supply part 301 corresponding to the main electrode 1040 of the first subpixel 010 refers to the first power supply part 301 overlapping with the main electrode 1040 of the first subpixel 010.

Referring to FIGS. 3-6, a connection line of the two endpoints A1 and A2 of the main electrode 1040 of the first subpixel 010 farthest from each other in the second direction Y is an endpoint connection line L2; and in the third direction Z, the endpoint connection line L2 overlaps with the first main portion 31.

For example, referring to FIGS. 3-5, the first main portion 31 and the second main portion 32 are adjacent two portions of the first power supply part 301; and in the second direction Y, the maximum size L11 of the first main portion 301 is greater than the maximum size L12 of the second main portion 32 in the first power supply part 301, and the orthographic projection area of the first main portion 31 on the base substrate 001 is greater than the orthographic projection area of the second main portion 32 on the base substrate 001. By overlapping the endpoint line L2 of the main electrode 1040 with the first main portion 31, the larger portion of the main electrode 1040 overlaps with the first main portion 31, thereby ensuring that the main electrode 1040 and the first power supply part 301 have a large overlapping region. For example, the extension direction of the endpoint connection line L2 of each main electrode 1040 is determined according to the arrangement direction of the main electrodes 1040. For example, the endpoint connection line L2 extends in the first direction N; for example, the endpoint connection line L2 extends in the second direction Y, and the embodiments of the present disclosure are not limited thereto.

For example, the first main portion 31 and the second main portion 32 are integral with each other.

For example, in the second direction Y, the maximum size L1 of the first power supply part 301 is equal to the maximum size L11 of the first main portion 31 in the embodiments of the present disclosure; when the maximum size M1 of the main electrode 1040 of the first subpixel 010 is not smaller than the maximum size L1 of the first power supply part 301, the orthographic projection of the main electrode 1040 of the first subpixel 010 on the base substrate 001 covers the orthographic projection of the first power supply part 301 on the base substrate 001 as much as possible. In this way, the flatness of the main electrode 1040 corresponding to the light-emitting region 103 is enhanced.

For example, the first power supply part 301 further includes a portion except for the first main portion 31 and the second main portion 32, and the embodiments of the present disclosure are not limited thereto.

In the embodiments of the present disclosure, by designing the matching way of the pixel circuit and the light-emitting element, the flatness of the first electrode in the light-emitting element is improved, and the probability of chromatic aberration and the like in the display product is reduced.

For example, referring to FIG. 4-FIG. 6, the plurality of power supply signal lines 300 include a first power supply signal line 300-1 and a second power supply signal line 300-2, the maximum sizes of the first power supply signal line 300-1 and the second power supply signal line 300-2 in the second direction Y are respectively the first size Lm and the second size Ln, and the second size Ln is smaller than the first size Lm. The maximum sizes of the plurality of power supply signal lines in the second direction Y provided in the embodiments of the present disclosure are not exactly the same, and they may be designed according to the shape and arrangement of the first electrodes 102 of the first subpixels 010 to improve the flatness of the first electrodes 102 in the first subpixels 010.

For example, in the plurality of power supply signal lines provided in embodiments of the present disclosure, the shape and arrangement of the first power supply parts 301 may be selected according to the type of the first subpixels 010. For example, the display substrate includes the first power supply parts 301 having different sizes in the second direction, for example, the display substrate includes first power supply parts 301 having different maximum sizes in the second direction, to correspond to the first subpixels 010 having the main electrode 1040 with different sizes in the second direction, respectively, so as to meet the needs of the actual patterning, which also allows the main electrodes 1040 of the first subpixels 010 to have good flatness, and reduces the risk of chromatic aberration of the display substrate.

For example, in the embodiments of the present disclosure, the first power supply parts 301 having different sizes in the second direction Y are not limited to two first power supply parts, and the first power supply parts 301 are provided according to the actual design requirements, which are not limited here.

For example, referring to FIG. 3, FIG. 5 and FIG. 6, the plurality of first subpixels 010 in the display substrate include at least one first type subpixel 111, and the first power supply part 301 overlapping with the main electrode 1041 of the first type subpixel 111 is the first type power supply part 3010. For example, the overlapping region of the main electrode 1041 of the first type subpixel 111 and the first main portion 311 of the first type power supply part 3010 is an asymmetric region.

For example, the first main portion 311 of the first type power supply part 3010 is an asymmetric structure. For example, the portion, overlapping with the main electrode 1041 of the first type subpixel 111, of the first type power supply part 3010 is an asymmetric region. "Asymmetric" in the embodiments of the present disclosure for example refers to that the structure or region is not symmetrically provided in any direction parallel to the base substrate.

For example, referring to FIGS. 3 and 5, the main electrode 1041 of the first type subpixel 111 has a large overlapping region with the first type power supply part 3010, and the overlapping region as a whole is asymmetric. For example, the orthographic projection area of the overlapping region on the base substrate 001 is 60%~95% of the orthographic projection area of the main electrode 1041 on the base substrate 001, the orthographic projection of the light-emitting region 103 of the first type subpixel 111 on the base substrate is provided in the orthographic projection of the main electrode 1041 on the base substrate, at this time, the overlapping region and the light-emitting region 103 are almost coincident, that is, the part of the main electrode 1041 overlapping with the light-emitting region 103 is uniformly and flatly disposed, which can improve the uniformity of the luminous intensity of the first type subpixel 111 and reduce the probability of chromatic aberration. For example, the orthographic projection area of the overlapping region on the base substrate 001 is 65%~90%, or 70%~85%, or 75%~80% of the orthographic projection area of the main electrode 1041 on the base substrate 001.

For example, as shown in FIG. 6, in the display substrate, the first main portion 311 of the first type power supply part 3010 includes a first protrusion 313, the first protrusion 313 is provided on a side of a first symmetric centerline L3 of the second main portion 312 extending along the first direction N.

For example, referring to FIGS. 5 and 6, in the display substrate, the extension direction of the symmetric centerline L4 of the portion of the first type power supply part 3010 except for the first protrusion 313 intersects with the extension direction of the second symmetric centerline L5 of the main electrode 1041 of the first type subpixel 111.

For example, the first symmetric centerline L3 coincides with the symmetric centerline L4. Of course, the embodiments of the present disclosure are not limited to this, and the two centerlines may be spaced apart from each other.

For example, referring to FIGS. 3-6, the second main portion 312 of the first type power supply part 3010 is symmetrically distributed relative to the first symmetric centerline L3. In the case that the first protrusion 313 is not provided, the maximum size of the first main portion 311 in the second direction is the same as the second main portion 312, and the first type power supply part 3010 is also symmetrically distributed relative to the first symmetric centerline L3. In order to match the main electrode 1041 of the first type subpixel 111 as much as possible, the first protrusion 313 is only provided on one side of the first main portion 311 relative to the first symmetric centerline L3, so that the first protrusion 313 increases the overlapping region of the main electrode 1041 and the first type power supply part 3010, which can better flatten the main electrode 1041, thereby increasing the flatness of the main electrode 1041.

For example, the main electrode 1041 corresponding to the first type power supply part 3010 may be disposed in a variety of forms. For example, referring to FIGS. 3 and 5, the main electrode 1041 is basically symmetrically distributed relative to the second symmetric centerline L5. For example, in the embodiments of the present disclosure, the symmetric centerline L4 and the second symmetric centerline L5 are disposed perpendicularly, so that the overlapping region of the first type power supply part 3010 and the main electrode 1041 is maximized as much as possible, and the protrusion corner of the main electrode 1041 covers the first protrusion 313 of the first type power supply part 3010, thereby improving the flatness of the main electrode 1041.

For example, the included angle between the extension direction of the symmetric centerline LA and the extension direction of the second symmetric centerline L5 is 20~90 degrees, such as 30~80 degrees, such as 45~60 degrees, etc.

For example, referring to FIGS. 3, 5 and 6, the plurality of first subpixels 010 in the display substrate further comprise at least one second type subpixel 112, and the first power supply part 301 overlapping with the main electrode 1042 of the second type subpixel 112 is a second type power supply part 3011.

For example, referring to FIGS. 3, 5 and 6, the second type power supply part 3011 comprises a third symmetric centerline L6 extending along the first direction N, the main electrode 1042 of the second type subpixel 112 includes a fourth symmetric centerline L7 extending along the first direction N, the third symmetric centerline L6 of the second type power supply part 3011 in the same column of power supply signal line and the fourth symmetric centerline L7 of the second type subpixel 112 overlapping with the second type power supply part 3011 are provided in the same plane perpendicular to the base substrate 001. For example, the orthographic projection of the third symmetric centerline L6 on the base substrate coincides with the orthographic projection of the fourth symmetric centerline L7 on the base substrate.

For example, referring to FIGS. 3, 5 and 6, the second type subpixel 112 is disposed on the side of the second type power supply part 3011 facing away from the base substrate, and the second type power supply part 3011 is symmetrically distributed relative to the third symmetric centerline. For example, according to the different forms of the first subpixels 010 in the display substrate, the main electrode 1042 of the second type subpixel 112 may be considered to be obtained by rotating the main electrode 1041 of the first type subpixels 111 clockwise or counterclockwise by a certain angle. The rotation angle in the embodiments of the present disclosure for example is 90°, therefore, the fourth symmetric centerline L7 of the main electrode 1042 of the second type subpixel 112 is also rotated clockwise or counterclockwise relative to the main electrode 1041 of the first type subpixel 111. The main electrode 1042 of the second type subpixel 112 is disposed on the side of the second type power supply part 3011 facing away from the base substrate, therefore, the third symmetric centerline L6 of the second type power supply part 3011 and the fourth symmetric centerline L7 of the second type subpixel 112 overlapping with the second type power supply part 3011 are parallel and are provided in the same plane perpendicular to the base substrate 001. For example, when the same column of power supply signal line 300 corresponds to a plurality of second type subpixels 112, the plurality of third symmetric centerlines L6 of the plurality of second type power supply parts 3011 and the plurality of fourth symmetric centerlines L7 of the plurality of second type subpixels 112 overlapping with the plurality of second type power supply parts 3011 in the same column of power supply signal line 300 are provided in the same plane perpendicular to the base substrate 001.

For example, referring to FIG. 3, FIG. 5, FIG. 6 and FIG. 7, the main electrode 1040 of the first subpixel 010 includes a first corner 141 and a second corner 142 opposite to each other, and a third corner 143 and a fourth corner 144 opposite to each other, the orthographic projection of at least one of the first corner 141 and the second corner 142 on the base substrate 001 and the orthographic projection of the first symmetric centerline L3 on the base substrate 001 at least partially overlap with each other; the orthographic projection of the fourth corner 144 on the base substrate 001 and the orthographic projection of the first protrusion 313 on the base substrate 001 at least partially overlap with each other.

For example, referring to FIG. 3, FIG. 5, FIG. 6 and FIG. 7, the lines constituting the first corner 141, the second corner 142, the third corner 143 and the fourth corner 144 are extended so that the main electrode 1040 is of approximately quadrilateral. For the main electrode 1041 of the first type subpixel 111, the first corner 141 and the second corner 142 are opposite to each other, and the pointing direction of the vertex of the first corner 141 pointing to the vertex of the second corner 142 intersects with the extension direction of the second symmetric centerline L5, for example, in the embodiments of the present disclosure, the pointing direction of the vertex of the first corner 141 pointing to the vertex of the second corner 142 is perpendicular to the extension direction of the second symmetric centerline L5.

For example, at least one of the first corner 141, the second corner 142, the third corner 143 and the fourth corner 144 is formed by extending 1~5 microns of the extension lines on both sides of the corner vertex; for example, the extension length of the extension lines on both sides of the corner vertex is 1/10 of the length of the edge between the adjacent two corners in the main electrode 1040. For example, when the vertex angle of at least one of the first corner 141, the second corner 142, the third corner 143 and the fourth corner 144 is rounded, the corresponding corner is formed by extending the arc lines on both sides of the rounded vertex angle by 1~5 microns. For example, the range of the angle of at least one of the first corner 141, the second corner 142, the third corner 143, and the fourth corner 144 is 70°~150°. For example, the range of the angle of at least one of the first corner 141, the second corner 142, the third corner 143 and the fourth corner 144 is 80°~ 120°. For example, the range of the angle of at least one of the first corner 141, the second corner 142, the third corner 143 and the fourth corner 144 is 90°~100°.

For example, the main electrode 1041 of the first type subpixels 111 is disposed on the side of the first type power supply part 3010 facing away from the base substrate 001, in this case, the pointing direction of the vertex of the first corner 141 pointing to the vertex of the second corner 142 and the extension direction of the symmetric centerline L4 of the first type power supply part 3010 are the same, and the pointing direction of the vertex of the third corner 143 pointing to the vertex of the fourth corner 144 and the extension direction of the second symmetric centerline L5 basically coincides with each other. At this time, as shown in FIG. 5, the orthographic projection of the first protrusion 313 on the base substrate 001 falls into the orthographic projection of the fourth corner 144 on the base substrate 001, so that the overlapping region of the first type power supply part 3010 and the main electrode 1041 is maximized, and the flatness of the main electrode 1041 is improved.

For example, referring to FIG. 3, FIG. 5, FIG. 6 and FIG. 7, the first main portion 314 of the second type power supply part 3011 comprises a second protrusion 317 and a third protrusion 318, and the second protrusion 317 and the third protrusion 318 are symmetrically distributed relative to the third symmetric centerline L6.

For example, referring to FIG. 3, FIG. 5, FIG. 6 and FIG. 7, the main electrode 1042 of the second type subpixels 112 comprises the first corner 141 and the second corner 142 opposite to each other, and the third corner 143 and the fourth corner 144 opposite to each other, the orthographic projection of the second protrusion 317 on the base substrate 001 at least partially overlaps with the orthographic projection of one of the first corner 141 and the second corner 142 on the base substrate 001, the orthographic projection of the third protrusion 318 on the base substrate 001 at least partially overlaps with the orthographic projection of the other of the first corner 141 and the second corner 142 on the base substrate 001.

For example, referring to FIG. 3, FIG. 5, FIG. 6 and FIG. 7, the arrangement form of the second type subpixels 112 is different from that of the first type subpixels 111, and the main electrode 1042 of the second type subpixel 112 is rotated by 90° counterclockwise relative to the main electrode 1041 of the first type subpixel 111. For example, the direction of the vertex of the third corner 143 pointing to the vertex of the fourth corner 144 is basically coincided with the third symmetric centerline L6. Therefore, the second type subpixels 112 for example include two arrangement forms relative to the second type power supply part 3011: the orthographic projection of the second protrusion 317 on the base substrate 001 overlaps with the orthographic projection of the first corner 141 on the base substrate 001, and the orthographic projection of the third protrusion 318 on the base substrate 001 overlaps with the orthographic projection of the second corner 142 on the base substrate 001; or the orthographic projection of the second protrusion 317 on the base substrate 001 overlaps with the orthographic projection of the second corner 142 on the base substrate 001, and the orthographic projection of the third protrusion 318 on the base substrate 001 overlaps with the orthographic projection of the first corner 141 on the base substrate 001. According to the above two arrangement forms, in the adjacent two second type subpixels 112, the directions of the vertex of the third corner 143 pointing to the vertex of the fourth corner 144 are opposite to each other, in this case, the orthographic projections of the second protrusion 317 and the third protrusion 318 in the second type power supply part 3011 on the base substrate 001 fall into the orthographic projection of the main electrode 1042 on the base substrate 001, thereby improving the flatness of the main electrode 1042. The above "adjacent two second type subpixels" for example refers to in a direction parallel to the base substrate, no other second type subpixels are arranged between these adjacent two second type subpixels, but other type subpixels may be arranged.

For example, referring to FIGS. 3, 5 and 6, the direction of the arrow of the N direction shown in FIG. 5 points downward, the second type subpixels 112 includes a first kind subpixel in which the third corner 143 is provided on the fourth corner 144 and a second kind subpixel in which the third corner 143 is provided below the fourth corner 144; at least part of the third corner 143 of the first kind subpixel overlaps with the first main portion 314 of the second type power supply part 3011, at least part of the third corner 143 of the second kind subpixel overlaps with the second main portion 315 of the second type power supply part 3011. For example, the first electrode 102 of each subpixel further comprises the connection electrode electrically connected to the pixel circuit 200 (see descriptions below), the third corner 143 is closer to the connection electrode than the fourth corner 144 in the first kind subpixel, and the fourth corner 144 is closer to the connection electrode than the third corner 143 in the second kind subpixel.

For example, in the embodiments of the present disclosure, referring to FIGS. 3-6, along the third direction Z, the light-emitting region 1032 of the second type subpixel 112 overlaps with at least one of the second protrusion 317 and the third protrusion 318. The light-emitting region 1032 limits the light output range of the second type subpixel 112; in the case that the second type subpixels 112 are arranged in accordance with the above two arrangement forms relative to the second type power supply part 3011, the orthographic projections of the second protrusion 317 and the third protrusion 318 on the base substrate 001 fall into or overlap with the orthographic projection of the emitting region 1032 of the main electrode 1042 on the base substrate 001, in this case, it is guaranteed to enhance the flatness of the main electrode 1042 corresponding to the emitting region 1032, which prevents chromatic aberration.

For example, referring to FIG. 3 and FIG. 6, according to the arrangement form of the first subpixels 111, the shape design of the first type power supply part 3010 and the shape design of the second type subpixel 3011 are correspondingly changed.

For example, in the second direction Y, the maximum size L13 of the first main portion 314 of the second type power supply part 3011 is greater than the maximum size L11 of the first main portion 311 of the first type power supply part 3010, and the ratio of the maximum size L12 of the second main portion 312 of the first type power supply part 3010 to the maximum size L13 of the second main portion 315 of the second type power supply part 3011 is 0.9~1.1. For example, the maximum size L12 of the second main portion 312 of the first type power supply part 3010 is equal to the maximum size L13 of the second main portion 315 of the second type power supply part 3011.

For example, referring to FIGS. 5 and 6, the main electrode 1042 of the second type subpixel 112 is rotated by 90° clockwise or counterclockwise relative to the main electrode 1041 of the first type subpixel 111, the main electrode 1042 of the first subpixel 010 has a symmetrical structure, for example, the main electrode 1042 of the second type subpixel 112 is symmetrically distributed relative to the fourth symmetric centerline L7, and the second type power supply part 3011 is symmetrically distributed relative to the second symmetric centerline L6, the third symmetric centerline L6 is parallel to the fourth symmetric centerline L7, and the third symmetric centerline L6 and the fourth symmetric centerline L7 are provided in the same plane perpendicular to the base substrate 001.

For example, the distance between the vertex of the first corner 141 and the vertex of the second corner 142 is smaller than the distance between the vertex of the third corner 143 and the vertex of the fourth corner 144. The first corner 141 and the second corner 142 are distributed on two sides of the fourth symmetric centerline L7 of the main electrode 1042 and are provided on the side of the second type power supply part 3011 facing away from the base substrate 001, the first corner 141 and the second corner 142 correspond to the second protrusion 317 and the third protrusion 318, respectively. On the side of the first type power supply part 3010 facing away from the base substrate 001, the fourth corner 144 corresponds to the first protrusion 313 of the first type power supply part 3010. Thus, the maximum size L13 of the first main portion 314 of the second type power supply part 3011 is greater than the maximum size L11 of the first main portion 311 of the first type power supply part 3010.

For example, as shown in FIG. 5, the main electrode 1041 of the first type subpixel 111 comprises two portions provided on two sides of the endpoint connection line L2, and in at least one of these two portions, in the direction parallel to the first direction N and gradually facing away from the endpoint connection line L2, the maximum size of the main electrode 1041 in the second direction Y gradually decreases.

For example, the second main portion 312 of the first type power supply part 3010 corresponds to the portion where the maximum size of the main electrode 1041 gradually decreases, therefore, there is no need to provide other protrusion structures on the second main portion 312 to improve the flatness of the main electrode 1041 corresponding to the portion, and the maximum size of the second main portion 312 in the second direction Y is smaller than the maximum size of the first main portion 311 in the second direction Y.

Similarly, for the second type subpixel 112, the maximum size L14 of the second main portion 315 of the second type power supply part 3011 in the second direction Y is also smaller than the maximum size L13 of the first main portion 314 in the second direction Y.

In some embodiments of the present disclosure, the difference between the maximum size of the main electrode 1041 of the first type subpixel 111 in the second direction Y and the maximum size of the main electrode 1042 of the second type subpixel 112 in the second direction Y is not particularly large, therefore, the difference between the size reduction trend of the main electrode 1041 in the first direction N and the size reduction trend of the main electrode 1042 in the first direction N is not particularly large. The second main portion 312 of the first type power supply part 3010 and the second main portion 315 of the second type power supply part 3011 for example are similar in the maximum size in the second direction Y. For example, the ratio of the maximum size L12 of the second main portion 312 of the first type power supply part 3010 and the maximum size L13 of the second main portion 315 of the second type power supply part 3011 is 0.9~1.1. For example, the ratio is 1, that is, L12 is equal to L13, which ensures the flatness of the main electrode 1041 and/or the main electrode 1042, and facilitates the manufacturing of the product and reducing the manufacturing cost.

For example, the maximum size L13 of the first main portion 314 of the second type power supply part 3011 in the second direction Y is 1.1-2 times of the maximum size L14 of the second main portion 315 of the second type power supply part 3011 in the second direction Y. For example, in the second type power supply part 3011, the maximum size L13 of the first main portion 314 is 1.2~1.9 times of the maximum size L14 of the second main portion. For example, in the second type power supply part 3011, the maximum size L13 of the first main portion 314 is 1.3~1.8 times of the maximum size L14 of the second main portion. For example, in the second type power supply part 3011, the maximum size L13 of the first main portion 314 is 1.4~1.7 times of the maximum size L14 of the second main portion. For example, in the second type power supply part 3011, the maximum size L13 of the first main portion 314 is 1.5~1.6 times of the maximum size L14 of the second main portion.

For example, in the first type power supply part, the maximum size of the first main portion in the second direction is 1.1~1.8 times of the maximum size of the second main portion in the second direction, such as 1.2~1.7 times, or 1.3~1.6 times, or 1.4~1.5 times, etc.

For example, the maximum size L13 of the first main portion 314 of the second type power supply part 3011 is designed as large as possible in the second direction Y, for example, in some embodiments of the present disclosure, the maximum size L13 of the first main portion 314 in the second direction Y is 1.5 times of the maximum size L14 of the second main portion 315 in the second direction Y, which ensures that the first corner 141 and the second corner 142 of the main electrode 1042 of the second type subpixel 112 just cover the first protrusion 317 and the second protrusion 318 of the first main portion 314 to ensure the flatness of the main electrode 1042 of the second type subpixel 112, and at the same time makes the ratio between the maximum size L13 and the maximum size L14 uniform as much as possible so as to simplify layout design and manufacturing.

For example, referring to FIGS. 5 and 6, each power supply signal line 300 in the adjacent plurality of power supply signal lines 300 in the display substrate comprises a plurality of power supply parts 300-3 arranged in the first direction N, and a first connection portion 330 is provided between and electrically connected to two adjacent power supply parts 300-3, and the plurality of power supply parts 300-3 comprise the first power supply part 301 as described above, and the ratio of the maximum size of each power supply part in the second direction Y to the maximum size L30 of the first connection portion 330 in the second direction Y is 1.5-5.

For example, the ratio of the maximum size of each power supply part 300-3 in the second direction Y to the maximum size L30 of the first connection portion 330 in the second direction Y is 2-4.5, such as 2.5-4, or 3-3.5, etc.

For example, referring to FIGS. 3-6, the display substrate comprises the plurality of power supply signal lines 300 extending in the first direction N, and at least one power supply part 300-3 is provided in each power supply signal line 300. The power supply part 300-3 is the first power supply part 301, or the second power supply part 302. The first power supply part 301 corresponds to the first subpixel 010, and the second power supply part 302 corresponds to the second subpixel. The first power supply part 301 further includes the first type power supply part 3010 corresponding to the first type subpixel 111, and the second type power supply part 3011 corresponding to the second type subpixel 112. For each power supply part 300-3, the orthographic projection of the power supply part 300-3 on the base substrate 001 and the orthographic projection of its corresponding main electrode on the base substrate 001 at least partially overlap with each other. For example, the orthographic projection of each power supply part 300-3 on the base substrate 001 and the orthographic projection of its corresponding main electrode on the base substrate 001 overlap with each other with an overlapping region as large as possible, for example, the overlapping region is at least 90% of the orthographic projection area of the main electrode corresponding to the power supply part 300-3 on the base substrate 001, so that the main electrode corresponding to the power supply part 300-3 has a higher flatness.

Referring to FIGS. 5 and 6, the adjacent two power supply parts 300-3 are electrically connected by the first connection portion 330, that is, all power supply parts 300-3 of the same power supply signal line 300 are electrically connected with each other. The ratio of the maximum size of the power supply part 300-3 in the second direction Y to the maximum size L30 of the first connection portion 330 in the second direction Y for example is 1.5-5, for example, 4, or 2, or 3, etc. Relative to each power supply part 300-3, in the premise of realizing the electrical connection function, the maximum size L30 of the first connection portion 330 in the second direction Y is designed to be smaller, which allows that more blank space is remained, the layout is uncrowded and facilitates the layout arrangement.

For example, referring to FIGS. 5 and 6, the first type power supply part 3010 includes a first subtype power supply part 3016 and a second subtype power supply part 3017, the second main portion 312 of the first type power supply part 3010 comprises a first side K1 and a second side K2 opposite each other in the second direction Y, the first protrusion 3131 of the first subtype power supply part 3016 is disposed on the first side K1 of the second main portion 312, the first protrusion 3132 of the second subtype power supply part 3017 is disposed on the second side K2 of the second main portion 312.

For example, as shown in FIG. 6, the arrow of the Y direction points to the right, the first protrusion 3131 of the first subtype power supply part 3016 is provided on the left side of the second main portion 312, the first protrusion portion 3132 of the second subtype power supply part 3017 is provided on the right side of the second main portion 312.

For example, the first subtype power supply part 3016 and the second subtype power supply part 3017 adjacent to each other in the Y direction are symmetrically distributed relative to a straight line extending in the N direction. The "first subtype power supply part 3016 and the second subtype power supply part 3017 adjacent to each other" may refer to that no other first subtype power supply part 3016 and second subtype power supply part 3017 are disposed between these two power supply parts, but other types of power supply parts may be provided.

For example, the plurality of power supply parts of each power supply signal line 300 may be different, for example, the maximum sizes of different power supply parts in the second direction Y may be different, so that it can be flexibly adapted to the arrangement of different main electrodes, and to meet the flatness requirements of different main electrodes.

For example, referring to FIGS. 5 and 6, the first type subpixels 111 includes two arrangement forms. For example, as shown in FIGS. 5 and 6, the first type subpixels 111 includes a third kind subpixel in which the third corner 143 is provided on the left side of the fourth corner 144 and a fourth subpixel in which the third corner 143 is provided on the right side of the fourth corner 144, the fourth corner 144 of the fourth kind subpixel overlaps with the first protrusion 313 of the first subtype power supply part 3016, the fourth corner 144 of the third type subpixel overlaps with the first protrusion 313 of the second subtype power supply part 3017.

For example, as shown in FIG. 5, the main electrode 1041 of the first type subpixel 111 is symmetrically distributed relative to the plane P1. The first protrusion 3131 of the first subtype power supply part 3016 and the first protrusion 3132 of the second subtype power supply part 3017 are disposed on opposite sides. In this way, under the above two arrangement forms, the orthographic projection of the fourth corner 144 of the main electrode 1041 of the first type subpixel 111 on the base substrate 001 covers the orthographic projection of the first protrusion 3131 or the second protrusion 3132 on the base substrate 001 to ensure the flatness of the main electrode 1041 at the fourth corner 144.

For example, referring to FIGS. 5 and 6, the main electrode 1040 of the first subpixel 010 includes the first corner 141, the second corner 142, the third corner 143 and the fourth corner 144, the edges or their extension lines of the main electrode 1040 are connected into a polygon H0, each of the plurality of vertex angles of the polygon H0 has a region that does not overlap with the corresponding corner of the main electrode, and the non-overlapping region A12 of the third corner 143 and the corresponding vertex angle of the polygon H0 is greater than the non-overlapping region of each of at least some of other corners and the corresponding vertex angle of the polygon.

For example, referring to FIG. 5 and FIG. 6, the four extension lines H1, H2, H3 and H4 of the main electrode 1040 constitute the polygon H0. Corresponding to the first corner 141, the vertex angle of the polygon H0 includes a non-overlapping region A10; corresponding to the second corner 142, the vertex angle of the polygon H0 includes a non-overlapping region A11; corresponding to the third corner 143, the vertex angle of the polygon H0 includes a non-overlapping region A12; corresponding to the fourth corner 144, the vertex angle of the polygon H0 includes a non-overlapping region A13.

For example, the four corners of the main electrode 1040 include chamfers of different sizes, for example, in the embodiments of the present disclosure, the chamfer at the third corner 143 is greater than the chamfer at the other corners, such that the non-overlapping region A12 of the third corner 143 and the corresponding vertex angle of the polygon H0 is greater than the non-overlapping region of other corner and its corresponding vertex angle of the polygon H0. Of course, in some embodiments, the size of the chamfer of each corner of the main electrode 1040 may be designed according to the size requirements of each light-emitting region, and the shape of each main electrode provided in the embodiments of the present disclosure is only exemplary and is not intended to limit the scope of the present disclosure. This ensures the flexibility in the shape design of the main electrode.

For example, the above chamfer refers to the vertex angle formed by a curve, and the curve is a circular arc or an irregular curve, such as a curve taken from an ellipse, a wavy line, etc. The embodiments of the present disclosure illustrate that the curve protruding outward relative to the center of the subpixel, but it is not limited to this, it may also have a concave shape relative to the center of the subpixel. For example, the curve is circular arc, the range of the central angle of the circular arc is 10°~150°. For example, the central angle of the circular arc ranges from 60°~120°. For example, the central angle of the circular arc is 90°. For example, the curve length of the rounded chamfer of the third corner 143 is 10~60 microns. For example, the curvature radius of the chamfer at the third corner 143 is greater than the curvature radius of the chamfer at the other corners.

For example, as shown in FIGS. 5 and 6, the second main portion 32 of the first type power supply part 3010 and the second type power supply part 3011 comprises two straight edges extending in the first direction N. For example, the edge, opposite to the first protrusion 313, of the first main portion 311 in the first type power supply part 3010 is a straight edge extending in the first direction N, and the straight edge is in the same line as a straight edge of the second main portion 312.

For example, as shown in FIGS. 5 and 6, the first protrusion 313 comprises an inclined edge connected to the straight edge of the second main portion 312, the included angle between the inclined edge and the first direction N is 10~90 degrees, such as 20~80 degrees, such as 30~70 degrees, such as 40~60 degrees, such as 45 degrees. For example, the included angle between the inclined edge and the line connecting the fourth corner 144 and the first corner 141 is 0~30 degrees, such as 2~25 degrees, such as 5~20 degrees, such as 7~15 degrees, such as 8~10 degrees. For example, the edge of the first protrusion 313 facing away from the second main portion 312 is parallel to the second direction Y, the connection line connecting the end of such edge facing away from the centerline of the second main portion 312 extending along the first direction N and the end of the inclined edge facing away from the centerline may include a polyline or curve.

For example, as shown in FIGS. 5 and 6, one of the second protrusion 317 and the third protrusion 318 has the same shape and size as the first protrusion 313, the second protrusion 317 and the third protrusion 318 are symmetrically distributed relative to the third symmetric centerline L6 of the second type power supply part 3011 extending along the first direction N.

For example, as shown in FIGS. 5 and 6, the shape and size of the second main portion 32 of the first type power supply part 3010 are the same as those of the second main portion 32 of the second type power supply part 3011, the first main portion 311 of the first type power supply part 3010 except for the first protrusion 313 and the first main portion 314 of the second type power supply part 3011 except for the second protrusion 317 and the third protrusion 318 have the same shape and size.

For example, as shown in FIGS. 5 and 6, the first subpixel is a subpixel emitting light of single color, such as a subpixel emitting blue light; the overlapping regions of the power supply signal line and the first electrodes of different subpixels emitting light of the same color may have different shape, and the overlapping regions may have different areas.

For example, the first subpixel 111 having the above four corners are evenly distributed in the display area of the display substrate, but the embodiments of the disclosure are not limited thereto; the display substrate for example includes a first display area and a second display area, the first subpixel 111 having the above four corners are distributed only in the first display area. For example, the first display area is an area for arranging a camera under the screen, the second display area is a normal display area; by providing the first subpixels having the four corners in the area for disposing the camera under the screen, the light transmittance of the second display area is improved.

For example, referring to FIG. 3-FIG. 6, at least some subpixels further comprise a plurality of second subpixels 020; at least one power supply signal line 300 comprises a second power supply part 302 overlapping with the main electrode 1050 of at least one of the plurality of second subpixels 020 along the third direction Z. The second power supply part 302 includes a fifth symmetric centerline L32 extending in the first direction N, the main electrode 1050 of the second subpixel 020 includes a sixth symmetric centerline L33 extending along the first direction N, the fifth symmetric centerline L32 of the second power supply part 302 in the same column of power supply signal line 300 and the sixth symmetric centerline L33 of the second subpixel overlapping with the second power supply part 302 are provided in the same plane perpendicular to the base substrate 001.

For example, referring to FIG. 3-FIG. 6, the orthographic projection area of the main electrode 1050 of the second subpixel 020 on the base substrate 001 is smaller than the orthographic projection area of the main electrode 1040 of the first subpixel 010 on the base substrate 001, and the maximum size of the main electrode 1050 of the second subpixel 020 in the first direction N is smaller than the maximum size of the main electrode 1040 of the first subpixel 010 in the first direction N; the maximum size of the main electrode 1050 of the second subpixel 020 in the second direction Y is smaller than the maximum size of the main electrode 1040 of the first subpixel 010 in the second direction Y. The main electrode 1050 of the second subpixel 020 is symmetrically distributed relative to the sixth symmetric centerline L33 extending in the first direction N, the second power supply part 302 is symmetrically distributed relative to the fifth symmetric centerline L32 extending along the first direction N, and the main electrode 1050 is disposed on the side of the second power supply part 302 facing away from the base substrate 001. For the same second subpixel 020, the fifth symmetric centerline L32 of the second power supply part 302 and the sixth symmetric centerline L33 of the second subpixel overlapping with the second power supply part 302 are provided in the same plane perpendicular to the base substrate 001. The fifth symmetric centerline L32 is parallel to the sixth symmetric centerline L33, and both are provided in the same plane perpendicular to the base substrate 001. When the same column of power supply signal line 300 corresponds to a plurality of second subpixels 020, the fifth symmetric centerline L32 and the sixth symmetric centerline L33 in the same column of power supply signal line 300 are provided in the same plane perpendicular to the base substrate 001.

In this way, the orthographic projection of the main electrode 1050 on the base substrate 001 covers the orthographic projection of the second power supply part 302 on the base substrate 001 as much as possible, so that the main electrode 1050 is flat.

For example, referring to FIGS. 3-6, the orthographic projection of the main electrode 1050 of the second subpixel 020 on the base substrate 001 and the orthographic projection of the second power supply part 302 on the base substrate 001 overlap with each other, and the overlapping region area AS1 is at least 90% of the orthographic projection area AS of the main electrode 1050 of the second subpixel 020 on the base substrate 001. For example, the overlapping region area AS1 is at least 92%, or 95%, or 98% of the orthographic projection area AS of the main electrode 1050 of the second subpixel 020 on the base substrate 001.

For example, referring to FIGS. 3-6, compared with the orthographic projection of the second power supply part 302 on the base substrate 001, the orthographic projection of the main electrode 1050 on the base substrate 001 is smaller; and when the overlapping region area AS1 is more than 90% of the orthographic area AS of the main electrode 1050 of the second subpixel 020 on the base substrate 001, the main electrode 1050 in the light-emitting regions 1033 of the second subpixels 020 is almost flat as a whole, thereby effectively preventing the generation of chromatic aberration.

For example, as shown in FIGS. 3-6, the second power supply part 302 and the first power supply part 301 are different in shape. For example, the area of the second power supply part 302 is smaller than the area of the first power supply part 301. For example, the ratio of the maximum size of the second power supply part 302 in the second direction Y and the maximum size of the second main portion 32 of the first power supply part 301 in the second direction Y is 0.9~1.1. For example, the first type power supply part 3010 except for the first protrusion 313 has the same shape as the second power supply part 302, and has the same area as the second power supply part 302. For example, the second type power supply part 3011 except for the second protrusion 317 and the third protrusion 318 has the same shape as the second power supply part 302, and has the same area as the second power supply part 302.

For example, as shown in FIGS. 5 and 6, the plurality of power supply parts 300-3 arranged along the first direction N and included by the power supply signal line 300 include the first power supply parts 301 and the second power supply parts 302 alternately arranged, the same power supply signal line 300 comprises at least two different shapes of the power supply parts 300-3.

For example, as shown in FIGS. 5 and 6, the respective second power supply parts 302 have the same shape and area. For example, the different parts of the power supply signal line 300 overlapping with the first electrodes 102 of different second subpixels 020 have the same shape and area.

Of course, the embodiments of the present disclosure are not limited thereto. When the shape of the second subpixel 020 is formed to include four corners similar to those of the first subpixel 010, the shapes of the second power supply parts 302 overlapping with different second subpixels 020 may be different, in this case, the shape of the second power supply part 302 may be determined according to the shape of the first electrode 102 of each second subpixel 020.

For example, referring to FIGS. 5 and 6, the display substrate further comprises a plurality of data lines 400, the plurality of data lines 400 extend along the first direction N and are arranged in the second direction Y, the plurality of data lines 400 and the plurality of power supply signal lines 300 are provided in the same layer, the data lines 400 between adjacent two power supply signal lines 300 include a first data line 401 and a second data line 402 arranged in the second direction Y, the first data line 401 and the second data line 402 are symmetrically distributed relative to the seventh symmetric centerline L40 between the first data line 401 and the second data line 402.

For example, as shown in FIG. 6, the maximum size V of the first data line 401 and the second data line 402 between the adjacent two power supply signal lines 300 in the second direction Y is smaller than the maximum size L13 of the power supply signal line 300 in the second direction Y. Each data line further comprises a connection block 450 to connect the data line with a transistor in the pixel circuit 200. For the same power supply signal line 300, the connection block and the power supply part are arranged adjacently and are spaced apart from each other, the minimum distance between the connection block and the power supply part is about ⅓-⅔ of the size of the first connection portion 330 in the second direction Y, which facilitates to remain a blank space, and thus prevents signal interference between the signal lines. The above maximum size V for example includes a line width of the first data line 401, a line width of the second data line 402 and the distance between the first data line 401 and the second data line 402.

For example, as shown in FIG. 6, the distances between the first main portion 311 of the first type power supply part 3010 and the data lines (except for the connection block) respectively provided on two sides of and adjacent to the first main portion 311 of the first type power supply part 3010 are not same. For example, the distances between the second main portion 312 of the first type power supply part 3010 and the data lines (except for the connection block) respectively provided on two sides of and adjacent to the second main portion 312 of the first type power supply part 3010 are same. For example, the distances between the first main portion 314 of the second type power supply part 3011 and the data lines (except for the connection block) respectively provided on two sides of and adjacent to the first main portion 314 of the second type power supply part 3011 are same. For example, the distances between the second main portion 315 of the second type power supply part 3011 and the data lines (except for the connection block) respectively provided on two sides of and adjacent to the second main portion 315 of the second type power supply part 3011 are same. For example, the distances between the second power supply part 302 and the data lines (except for the connection block) respectively provided on two sides of and adjacent to the second power supply part 302 are same.

For example, referring to FIGS. 5 and 6, at least some subpixels 10 further comprise a plurality of third subpixels 030, the main electrode 1060 of the light-emitting element 100 of at least one of the plurality of third subpixels 030 at least partially overlaps with the data line 400, and the overlapping region AS2 of the main electrode 1060 of the third subpixel 030 and the data line 400 are substantially symmetrical relative to the seventh symmetric centerline L40.

For example, referring to FIGS. 5 and 6, the orthographic projection area of the main electrode 1060 of the third subpixel 030 on the base substrate 001 is smaller than the orthographic projection area of the main electrode 1050 of the second subpixel 020 on the base substrate 001, and the maximum size of the main electrode 1060 of the third subpixel 030 in the first direction N is smaller than the maximum size of the main electrode 1050 of the second subpixel 020 in the first direction N, the maximum size of the main electrode 1060 of the third subpixel 030 in the second direction Y is smaller than the maximum size of the main electrode 1050 of the second subpixel 020 in the second direction Y. For example, the third subpixels 030 may have two different arrangement forms, and the third subpixels 030 with two different arrangement forms are arranged symmetrically relative to the fourth symmetric centerline L7. As shown in FIG. 5, the overlapping region AS2 of the main electrode 1060 of the third subpixel 030 and the data line 400 comprises two parts, and the overlapping region AS2 is basically symmetrical relative to the seventh symmetric centerline L40. In this way, by distributing the overlapping region AS2 symmetrically relative to the seventh symmetric centerline L40, the flatness of the main electrode 1060 of the third subpixels 030 is increased to reduce the chromatic aberration of the third subpixels 030.

For example, as shown in FIG. 5, the main electrode 1060 of the third subpixel 030 overlaps with a portion of the data line 400 except for the connection block 450.

For example, referring to FIGS. 5 and 6, the display substrate further comprises a plurality of second connection portions 500, the plurality of second connection portions 500 and at least some of the plurality of power supply signal lines 300 are disposed in a same layer, each second connection portion 500 includes a first connector 501 and a second connector 502. The plurality of second connection portions 500 are arranged in an array along a first direction N and a second direction Y to form a plurality of second-connection-portion rows 503 and a plurality of second-connection-portion columns 504.

The power supply signal line 300 includes the plurality of power supply parts arranged in the first direction N, such as the first power supply part 301 and the second power supply part 302; the first connection portion 330 is provided between the adjacent two power supply parts and is electrically connected to both of the adjacent two power supply parts; and the plurality of power supply signal lines 300 include the power supply parts arranged in an array along the first direction N and the second direction Y to form a plurality of power-supply-part rows 308 and a plurality of power-supply-part columns 309.

A plurality of second-connection-portion rows 503 and a plurality of power-supply-part rows 308 are alternately arranged in the first direction N, and two adjacent second connection portions 500 in the same second-connection-portion row 503 are distributed on two sides of the data line 400.

For example, as shown in FIG. 6, the plurality of second connection portions 500 include a plurality of first connectors 501 and a plurality of second connectors 502, the plurality of first connectors 501 are arranged into a plurality of first-connector columns arranged in the second direction Y, the plurality of second connectors 502 are arranged into a plurality of second-connector columns arranged in the second direction Y, the plurality of first-connector columns and the plurality of second-connector columns are alternately arranged in the second direction Y.

For example, the first connector 501 and the second connector 502 have the same shape, or different shapes.

For example, in the same second-connection-part row 503, adjacent two second connection portions 500 are symmetrically distributed relative to the seventh symmetric centerline LA0; in the second direction, the minimum distance between the first connector 501 or the second connector 502 and the data line 400 is basically the same as the minimum distance between the first connector 501 or the second connector 502 and the first connection portion 330, thereby allows the spatial distribution the layout uniform and uncrowded.

For example, in some embodiments of the present disclosure, the plurality of power supply signal lines are disposed in different layers, and electrically connected in parallel, and correspondingly, the plurality of second connection portions 500 are disposed in different layers, the embodiments of the present disclosure are not limited thereto. For example, the adjacent two second connection portions 500 in the same second-connection-portion row 503 are not symmetrically distributed, and are designed according to the actual layout needs.

For example, referring to FIGS. 5 and 6, the first electrode 102 of the light-emitting element 100 further comprises a connection electrode 105 electrically connected to the main electrode 104, the connection electrode 105 does not overlap with the light-emitting region 103 of the light-emitting element 100, and the connection electrode 105 is electrically connected to the light-emitting control transistor T6 through the second connection portion 500.

For example, referring to FIGS. 5 and 6, the connection electrode 105 electrically connected to the main electrode 104 in each pixel circuit is disposed on one side of the main electrode 104; for example, the arrow of the direction Y in FIG. 7 points to the right, the connection electrodes 105 are disposed on the left sides of the centerline of the main electrodes 104 extending along the first direction N, respectively. The orthographic projection area of the connection electrode 105 on the base substrate 001 is smaller than the orthographic projection area of the main electrode 104 on the base substrate 001. For example, the orthographic projection of the connection electrode 105 on the base substrate 001 and the orthographic projection of the data line 400 on the base substrate 001 do not overlap with each other, and the orthographic projection of the connection electrode 105 on the base substrate 001 and the orthographic projection of the light-emitting region 103 on the base substrate 001 do not overlap with each other, thereby avoiding the interference of the connection electrode 105 on the signals in the data line and the light-emitting region 103, so as to ensure the performance of the pixel circuit 200.

For example, referring to FIG. 5 and FIG. 6, the connection electrode 105 of the light-emitting element 100 does not overlap with the first connection portion 330; and in the first direction N, the maximum size L975 of the main electrode 1040 of the first subpixel 010 is not smaller than the maximum size L985 of the first main portion 31 of the corresponding first power supply part 301.

For example, the orthographic projection of the connection electrode 105 of the light-emitting element 100 on the base substrate 001 and the orthographic projection of the first connection portion 330 on the base substrate 001 has almost no overlapping region. For example, the overlapping region is not greater than 1/15 of the orthographic projection area of the connection electrode 105 on the base substrate 001, which can reduce the crosstalk phenomenon that may occur between the signal lines.

For example, referring to FIGS. 5 and 6, the maximum size L975 of the main electrode 1040 of the first subpixel 010 is greater than the maximum size L985 of the first main portion 31. In some embodiments, the maximum size L985 of the first main portion 31 is 1/4-1/2 of the maximum size L975 of the main electrode 1040 of the first subpixel 010. For example, the maximum size L985 of the first main portion 31 is 1/3-2/3 of the maximum size L975 of the main electrode 1040 of the first subpixel 010. For example, the maximum size L975 of the main electrode 1040 of the first subpixel 010 is not smaller than the maximum size L985 of the first main portion 31 of the corresponding first power supply part 301, which is conducive to enhancing the flatness of the main electrode 1040.

For example, in the second direction Y, the first connection portion 330 is disposed between the first connector 501 and the second connector 502 of the same second connection portion 500, and the first connector 501 and the second connector 502 of the same second connection portion 500 are spaced from the first connection portion 330 between the first connector 501 and the second connector 502.

For example, referring to FIGS. 5 and 6, the plurality of second-connection-portion rows 503 and the plurality of power-supply-part row 308 are alternately arranged in the first direction N. i.e., one second-connection-portion row 503 is provided between the adjacent two power-supply-part rows; in the same second-connection-portion row 503, one first connection portion 330 is provided between the first connector 501 and the second connector 502 of each second connection portion 500, and the first connection portion 330 is spaced from the nearest first connector 501 and the nearest second connector 502. The connection electrode 105 of the light-emitting element 100 is electrically connected to the first connector 501 and the second connector 502, and the first connector 501 and the second connector 502 of the second connection portion 500 are spaced from adjacent first connection portion 330, thereby reducing the signal interference between the connection electrode 105 connected to the second connection 500 and the first connection portion 330.

For example, the orthographic projection of the main electrode 104 of the light-emitting element 100 on the base substrate and the orthographic projection of the second connection portion 500 on the base substrate are spaced apart from each other as much as possible, which can avoid the flatness of the main electrode 104 is affected by the second connection portion 500. For example, the first connector 501 and the second connector 502 of the same second connection portion 500 are symmetrically disposed relative to the first connection portion 330 between the first connector 501 and the second connector 502 of the same second connection portion 500, which can further facilitate the layout arrangement.

For example, referring to FIGS. 5 and 6, the maximum size L51 of the first connector 501 or the second connector 502 in the first direction N is smaller than the maximum size L52 of the first connection portion 330 in the first direction N.

For example, referring to FIG. 5 and FIG. 6, the first connection portion 330 is provided between the first connector 501 and the second connector 502 of the same second connection portion 500, the maximum size L52 of the first connection portion 330 is relatively large in the first direction N, and specifically, is larger than the maximum size L51 of the adjacent first connector 501 or the adjacent second connector 502 in the first direction N; in this case, it is advantageous to provide a certain distance between the two power supply parts connected at both ends of the first connection portion 330 in the first direction N and the first connector 501 as well as the second connector 502, and then the main electrodes 104 disposed on the two power parts also have a certain distance from the first connector 501 as well as the second connector 502, thereby preventing signal interference.

For example, referring to FIGS. 5 and 6, the first connector 501 is electrically connected with the connection electrode 1051 of the first subpixel 010 or the connection electrode 1051 of the second subpixel 020, and the second connector 502 is electrically connected with the connection electrode 1061 of the third subpixel 030.

For example, referring to FIG. 5 and FIG. 6, in the first direction, the connection electrode 1051 of the first subpixel 010, the connection electrode 1051 of the second subpixel 020 and the connection electrode 1051 of the third subpixel 030, which are adjacent to each other, are arranged sequentially and spaced apart from each other, and the connection electrode 1051 of the first subpixel 010 and the connection electrode 1051 of the second subpixel 020 are disposed on the side of the second connection portion 500 near the first connector 501; the connection electrode 1061 of the third subpixel 030 is disposed on the side of the second connection portion 500 near the second connector 502, in this case, they are also spaced apart from each other in the second direction. In this way, it is conducive to the utilization and design of the layout space.

Of course, in some embodiments, the number and position of the connectors in the second connection 500 may also vary accordingly according to the actual configuration, and the embodiments of the present disclosure are not limited thereto.

For example, as shown in FIG. 7, the plurality of subpixels 10 includes a plurality of first subpixels 010, a plurality of second subpixels 020, and a plurality of third subpixels 030. For example, one of the first subpixel 010 and the second subpixel 020 is a blue subpixel emitting blue light, the other of the first subpixel 010 and the second subpixel 020 is a red subpixel emitting red light, and the third subpixel 030 is a green subpixel emitting green light. For example, the first subpixel 010 is the blue subpixel, the second subpixel 020 is the red subpixel, and the area of the light-emitting region of the blue subpixel is greater than the area of the light-emitting region of the red subpixel. For example, the area of the light-emitting region of the blue subpixel is greater than the area of the light-emitting region of the green subpixel. Of course, the embodiments of the present disclosure are not limited thereto, the names of the first subpixel, the second subpixel and the third subpixel may be interchangeable, for example, the first subpixel is the green subpixel, the second subpixel is the blue subpixel, and the third subpixel is red subpixel; alternatively, the first subpixel is the blue subpixel, the second subpixel is the red subpixel, the third subpixel is the green subpixel, or the like.

For example, as shown in FIG. 7, the plurality of first subpixels 010 and the plurality of second subpixels 020 are alternately disposed along the first direction N and the second direction Y to form a plurality of first pixel rows 061 and a plurality of first pixel columns 062, the plurality of third subpixels 030 are arranged along the first direction N and the second direction Y to form a plurality of second pixel rows 071 and a plurality of second pixel columns 072.

The plurality of first pixel rows 061 and the plurality of second pixel rows 071 are alternately disposed along the first direction N and staggered from each other in the second direction Y; and the plurality of first pixel columns 062 and the plurality of second pixel columns 072 are alternately disposed along the second direction Y and staggered from each other in the first direction N.

The first direction and the second direction intersect with each other. For example, the first direction is perpendicular to the second direction. For example, the first direction and the second direction are interchangeable.

For example, the centers of the light-emitting regions of the adjacent first subpixel 010 and second subpixel 020 in the first pixel row 061, and the centers of the light-emitting regions of the first subpixel 010 and the second subpixel 020 adjacent to the adjacent first subpixel 010 and second subpixel 020 in the column direction are four vertices of a virtual quadrilateral, and the center of the light-emitting region of the third subpixel 030 is provided within the virtual quadrilateral.

For example, as shown in FIG. 7, the second pixel row 071 includes a plurality of third subpixel pairs 035 arranged along the second direction Y, two third subpixels 030 in each third subpixel pair 035 are respectively the first pixel block 0301 and the second pixel block 0302, and the first pixel blocks 0301 and the second pixel blocks 0302 are alternately disposed along the second direction Y. For example, the first pixel blocks 0301 and the second pixel blocks 0302 in the second pixel column 072 are alternately arranged in the first direction N.

For example, at least two second pixel rows 071 include a plurality of third subpixel pairs 035 arranged in the first direction, at least two third subpixel 030 in each third subpixel pair 035 are the first pixel block 0301 and the second pixel block 0302, respectively, and the first pixel blocks 0301 and the second pixel blocks 0302 are alternately disposed along the second direction Y. For example, the first pixel blocks 0301 and the second pixel blocks 0302 in at least two second pixel columns 072 are alternately disposed in the first direction N.

For example, as shown in FIG. 7, the plurality of subpixels 10 includes a plurality of smallest repeating units 700, each smallest repeating unit 700 comprises one first subpixel 010, one first pixel block 0301, one second pixel block 0302, and one second subpixel 020. For example, at least two smallest repeating units 700 include one first subpixel 010, one first pixel block 0301, one second pixel block 0302, and one second subpixel 020. For example, each smallest repeating unit 700 includes one first subpixel 010, one first pixel block 0301, one second pixel block 0302, and one second subpixel 020. For example, each smallest repeating unit 700 includes subpixels 10 of two rows and four columns.

For example, as shown in FIG. 7, in one smallest repeating unit 700, the first pixel block 0301 and the first subpixel 010 constitute a first pixel unit 701, the second pixel block 0302 and the second subpixel 020 constitute a second pixel unit 702.

For example, in at least two smallest repeating units 700, the first pixel block 0301 and the first subpixel 010 constitute the first pixel unit 701, the second pixel block 0302 and the second subpixel 020 constitute the second pixel unit 702.

The above first pixel unit and the above second pixel unit are not pixels in the strict sense, that is, the above first pixel unit and the above second pixel unit are not a pixel defined by the first subpixel 010, the second subpixel 020, and the third subpixel 030. The smallest repeating unit 700 here means that the pixel arrangement structure may include the plurality of smallest repeating units 700 that are repeatedly arranged.

For example, the first subpixel 010 and the second subpixel 020 are shared subpixels, and through the virtual algorithm, four subpixels can be displayed in two virtual pixel units.

It should be noted that the pixel arrangement structure provided in the embodiments of the present disclosure is only exemplary, which is not intended to limit the scope of the disclosure. In some embodiments of the present disclosure, according to the actual layout design needs, the pixel arrangement structure may be flexibly changed.

Referring to FIGS. 3 and 5, the connection electrodes 1051 of the plurality of first subpixels 010 and the connection electrodes 1051 of the plurality of second subpixels 020 are electrically connected to the corresponding second connection ports 500 respectively through a plurality of first connection holes D0, and the plurality of first connection holes D0 are provided in a plurality of first connection lines X1.

The connection electrodes 1061 of the plurality of third subpixels 030 are electrically connected to the corresponding second connection ports 500 through a plurality of second connection holes D1, and the plurality of second connection holes D1 are provided in a plurality of second connection lines X2, the first connection line X1 and the second connection line X2 extend along the second direction Y and spaced apart from each other.

For example, as shown in FIG. 3, the connection electrode 1051 of each of the plurality of first subpixels 010 and the connection electrode 1051 of each of the plurality of second subpixels 020 are distributed on a side of the end of the first connector, and the first connection line X1 extends along the second direction Y. The connection electrode 1061 of each of the plurality of third subpixels 030 is distributed near the middle of the second connector, and the second connection line X2 also extends along the second direction Y. The first connection line X1 and the second connection line X2 are spaced from each other in the first direction N, so that the plurality of first subpixels 010, the plurality of second subpixels 020 and the plurality of third subpixels 030 are spaced from each other in the first direction N, so that the layout space is more uniform.

For example, in some embodiments of the present disclosure, the plurality of first connection holes D0 may also have a certain deviation relative to the first connection line X1, that is, the plurality of first connection holes D0 may not be completely distributed in the first connection line X1. For example, at least one first connection hole DO has a deviation of 1-2 microns relative to the first connection line X1. For example, at least one first connection hole DO has a deviation of 2-3 microns relative to the first connection line X1. Similarly, the plurality of second connection holes D1 may have a certain deviation from the second connection line X2. For example, at least one second connecting hole D1 has a deviation of 1-2 microns relative to the second connection line X2. For example, at least one second connection hole D1 has a deviation of 2-3 microns relative to the second connection line X21.

For example, referring to FIG. 3-FIG. 6, in some embodiments of the present disclosure, in the same smallest repeating unit 700, the first connection holes D0 respectively corresponding to the first subpixel 010 and the second subpixel 020 are provided in the same first connection line X1, and the second connection holes D1 respectively corresponding to the first pixel block 0301 and the second pixel block 0302 are provided in the same second connection line X2. In some embodiments of the present disclosure, in the same smallest repeating unit 700, the first connection hole DO corresponding to the first subpixel 010, the first connection hole DO corresponding to the second subpixel 020, and the second connection hole D1 corresponding to the first pixel block 0301 are provided in the same first connection line X1, the second connection hole D1 corresponding to the second pixel block 0302 is provided in the second connection line X2. For example, in the same smallest repeating unit 700, the first connection hole DO corresponding to the first subpixel 010 is provided in the first connection line X1, the first connection hole DO corresponding to the second subpixel 020, the second connection hole D1 corresponding to the first pixel block 0301, and the second connection hole D1 corresponding to the second pixel block 0302 are provided in the second connection line X2, the embodiments of the present disclosure are not limited thereto.

For example, the first connection hole DO corresponding to the first subpixel 010, the first connection hole DO corresponding to the second subpixel 020, the second connection hole D1 corresponding to the first pixel block 0301, and the second connection hole D1 corresponding to the second pixel block 0302 are arranged at equal intervals. For example, according to the actual layout design needs, the first connection hole DO corresponding to the first subpixel 010, the first connection hole DO corresponding to the second subpixel 020, the second connection hole D1 corresponding to the first pixel block 0301, and the second connection hole D1 corresponding to the second pixel block 0302 are arranged at unequal intervals, and the embodiments of the present disclosure are not limited thereto.

As shown in FIG. 6, the first connection portion 330 includes at least one hollow-out portion 380, and the area of the hollow-out portion 380 is ¼-⅓ of the area of the first connection portion 330.

For example, in some embodiments of the present disclosure, the hollow-out portion 380 of the first connection portion 330 is a through hole or an opening penetrating through the first connection portion 330 in the direction perpendicular to the base substrate, so that the hollow-out portion 380 exposes the structure of the pixel circuit 200 provided on the side of the first connection portion 330 facing the base substrate 001, and for example the first connection portion 330 has a hollow-out pattern. For example, the hollow-out portion 380 of the first connection portion 330 and the first electrode 102 substantially do not overlap with each other. For example, the display product is provided with hollow-out portion 380 to enhance its transmittance. For example, the first connection portion 330 is provided with the hollow-out portion 380, which facilitates the light transmittance of the display substrate, so that the display effect is excellent. For example, the number of hollow-out portion 380 of the first connection portion is determined according to the actual layout design requirements, and the embodiments of the present disclosure are not limited thereto. For example, the hollow-out portion 380 is designed to have a regular shape, for example, the hollow-out portion 380 is designed as a polygon, oval, regular polygon and circle, etc. For example, the hollow-out portion 380 is designed as irregular shape. For example, the shapes of the plurality of hollow-out portions 380 are the same. For example, the shapes of the plurality of hollow-out portions 380 are designed differently. Embodiments of the present disclosure do not limit the shape of the hollow-out portion 380.

For example, the hollow-out portion 380 of the same first connection portion 330 is symmetrically distributed relative to the symmetric centerline of the first connection portion 330. For example, the position of the hollow-out portion 380 of the first connection portion 330 is determined according to the design needs of the actual layout, and the embodiments of the present disclosure are not limited thereto.

For example, in the same first connection portion 330, the boundary of the hollow-out portion 380 and the edge of the first connection portion 330 is not smaller than 1 micron to prevent the first connection portion 330 from being broken.

FIG. 8 is an equivalent diagram of the pixel circuit provided by the embodiments of the present disclosure.

For example, as shown in FIG. 8, the light-emitting control transistor T6 in the pixel circuit 200 is a first light-emitting control transistor T6, the pixel circuit 200 further comprises a second reset transistor T1, a threshold compensation transistor T2, a driving transistor T3, a data writing transistor T4, a second light-emitting control transistor T5, a first reset control transistor T7, and a storage capacitor C.

For example, the display substrate further includes reset power supply signal lines, scan signal lines, power supply signal lines, reset control signal lines, light-emitting control signal lines, and data lines.

For example, the first electrode of the threshold compensation transistor T2 is electrically connected to the first electrode of the driving transistor T3, and the second electrode of the threshold compensation transistor T2 is electrically connected to the gate electrode of the driving transistor T3; the first electrode of the first reset control transistor T7 is electrically connected to the reset power supply signal line to receive the reset signal Vinit, and the second electrode of the first reset control transistor T7 is electrically connected to the first electrode of the light-emitting element 100 (i.e., N4 node); the first electrode of the data writing transistor T4 and the second electrode of the driving transistor T3 are electrically connected with each other, the second electrode of the data writing transistor T4 and the data line are electrically connected with each other to receive the data signal Data, and the gate electrode of the data writing transistor T4 is electrically connected to the scan signal line to receive the scan signal Gate; the first electrode of the storage capacitor C is electrically connected to the power supply signal line, and the second electrode of the storage capacitor C is electrically connected to the gate electrode of the driving transistor T3; the gate electrode of the threshold compensation transistor T2 is electrically connected to the scan signal line to receive the compensation control signal; the gate electrode of the first reset transistor T7 is electrically connected to the reset control signal line to receive the reset control signal Reset (N+1); the first electrode of the second reset transistor T1 is electrically connected to the reset power supply signal line to receive the reset signal Vinit, the second electrode of the second reset transistor T1 is electrically connected to the gate electrode of the driving transistor T3, and the gate electrode of the second reset transistor T1 is electrically connected to the reset control signal line to receive the reset control signal Reset (N); the gate electrode of the first light-emitting control transistor T6 is electrically connected to the light-emitting control signal line to receive the light-emitting control signal EM; the first electrode of the first light-emitting control transistor T6 is electrically connected to the first electrode of the driving transistor T3, and the second electrode of the first light-emitting control transistor T6 is electrically connected to the first electrode of the light-emitting element 100; the first electrode of the second light-emitting control transistor T5 is electrically connected with the power supply signal line to receive the first power signal VDD, the second electrode of the second light-emitting control transistor T5 is electrically connected to the second electrode of the driving transistor T3; the gate electrode of the second light-emitting control transistor T5 is electrically connected with the light-emitting control signal line to receive the light-emitting control signal EM, and the second electrode of the light-emitting element 100 is connected with the voltage terminal VSS. The above power supply signal line refers to the signal line for outputting voltage signal VDD, which is connected to a voltage source to output a constant voltage signal, such as a positive voltage signal.

For example, the scan signal and the compensation control signal are the same, that is, the gate electrode of the data writing transistor T4 and the gate electrode of the threshold compensation transistor T2 are electrically connected to the same signal line to receive the same signal, reducing the number of signal lines. For example, the gate electrode of the data writing transistor T4 and the gate electrode of the threshold compensation transistor T2 are electrically connected to different signal lines respectively, that is, the gate electrode of the data writing transistor T4 is electrically connected to the first scan signal line, and the gate electrode of the threshold compensation transistor T2 is connected to the second scan signal line, and the signals transmitted by the first scan signal line and the second scan signal line may be the same or different, so that the gate electrode of the data writing transistor T4 and threshold compensation transistor T2 may be controlled separately, which increases the flexibility of controlling the pixel circuit 200.

For example, the light-emitting control signals input into the first light-emitting control transistor T6 and the second light-emitting control transistor T5 are the same, that is, the gate electrode of the first light-emitting control transistor T6 and the gate electrode of the second light-emitting control transistor T5 are electrically connected to the same signal line to receive the same signal, reducing the number of signal lines. For example, the gate electrode of the first light-emitting control transistor T6 and the gate electrode of the second light-emitting control transistor T5 are electrically connected to different light-emitting control signal lines, and different light-emitting control signal lines transmit the same signal or different signals.

For example, the reset control signals input into the first reset transistor T7 and the second reset transistor T1 are the same, that is, the gate electrode of the first reset transistor T7 and the gate electrode of the second reset transistor T1 are electrically connected to the same signal line to receive the same signal, reducing the number of signal lines. For example, the gate electrode of the first reset transistor T7 and the gate electrode of the second reset transistor T1 are electrically connected to different reset control signal lines, in which the signals on different reset control signal lines are the same or are different.

For example, as shown in FIG. 8, during the substrate works, in the first stage of the image display, the second reset transistor T1 is turned on, so that the voltage of the N1 node is initialized; in the second stage of the image display, the data signal Data is stored in the N1 node through the data writing transistor T4, the driving transistor T3, and threshold compensation transistor T2. In the third light-emitting stage, the second light-emitting control transistor T5, the driving transistor T3 and the first light-emitting control transistor T6 are turned on, and the light-emitting element 100 is conducted forward to emit light.

It should be noted that, in the embodiments of the present disclosure, in addition to the 7T1C (i.e., seven transistors and one capacitor) structure shown in FIG. 8, the pixel circuit may have other structures such as a 7T2C structure, a 6T1C structure, a 6T2C structure or a 9T2C structure, the embodiments of the present disclosure are not limited thereto. The equivalent diagram of the pixel circuit of the display substrate may be the same as the equivalent diagram of the pixel circuit 200 shown in FIG. 8.

Figure 9:
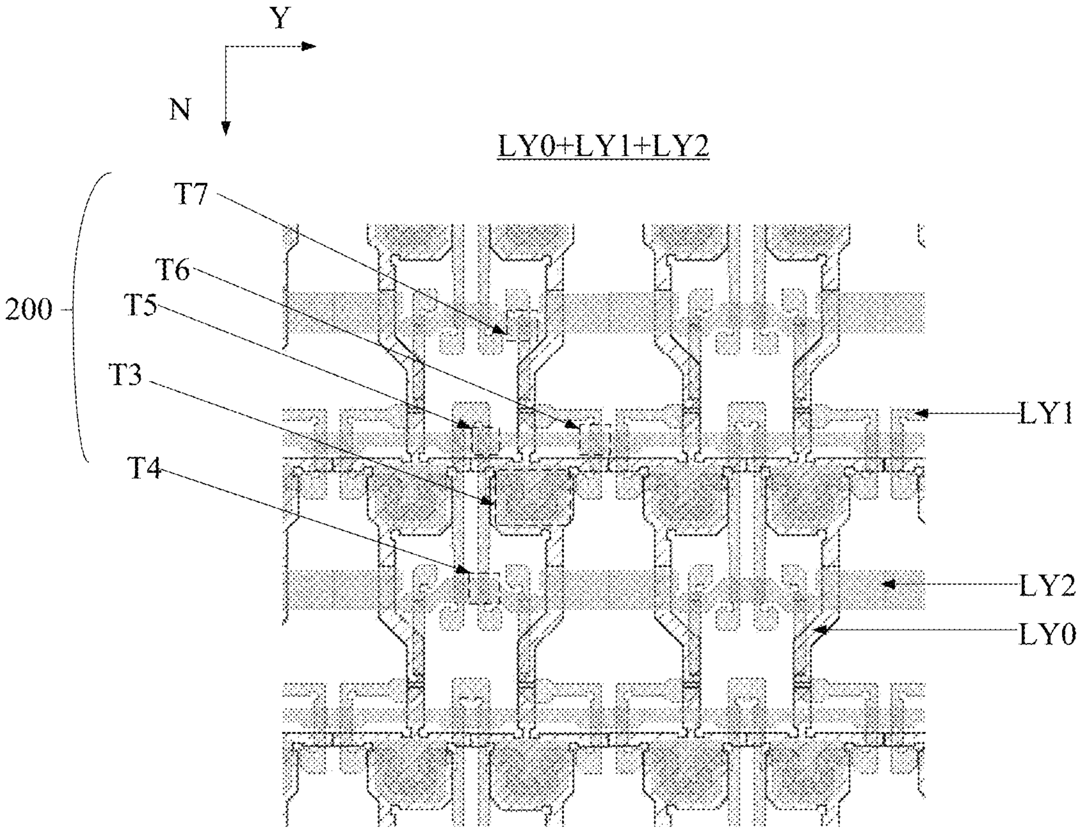
FIG. 9 is a schematic view of a stack structure of a light-shielding layer, an active semiconductor pattern, and a first connection layer in the pixel circuit provided by the embodiments of the present disclosure.
Figure 10:
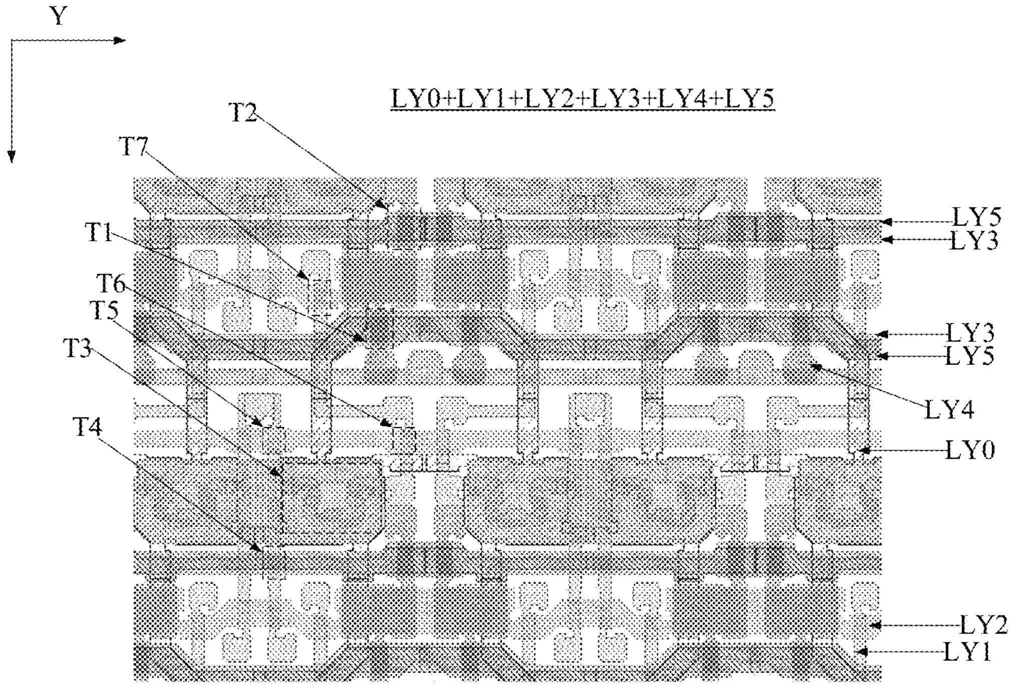
FIG. 10 is a schematic view of a stack structure of the light-shielding layer, the active semiconductor pattern, the first connection layer, a second connection layer, a semiconductor layer, and a third connection layer in the pixel circuit provided by the embodiments of the present disclosure.

FIG. 9 is a schematic view of a stack structure of a light-shielding layer, an active semiconductor pattern, and a first connection layer in the pixel circuit provided in the embodiments of the present disclosure. FIG. 10 is a schematic view of a stack structure of the light-shielding layer, the active semiconductor pattern, the first connection layer, a second connection layer, a semiconductor layer, and a third connection layer in the pixel circuit provided in the embodiments of the present disclosure.

As shown in FIG. 9, the active semiconductor pattern LY1 is disposed on the light-shielding layer LY0, and the active semiconductor pattern LY1 is formed by patterning a semiconductor layer. The active semiconductor pattern LY0 and the first connection layer LY2 may be used to form the active layers of the driving transistor T3, the data writing transistor T4, the second light-emitting control transistor T5, the first light-emitting control transistor T6 and the first reset control transistor T7, and the active layers are used for forming channel regions of these transistors. The active semiconductor pattern LY0 includes the active layer patterns (channel regions) and doped region patterns (source regions and drain regions) of the transistors of the various subpixels, and the active layer patterns and the doped region patterns of the transistors in the same pixel circuit are formed as an integral structure.

For example, the active semiconductor pattern LY1 is made of amorphous silicon, polysilicon, oxide semiconductor material, etc. It should be noted that the source regions and drain regions described above may be regions doped with n-type impurities or p-type impurities.

For example, a metal layer, such as a gate metal layer, is disposed on the side of the active semiconductor pattern LY1 facing away from the base substrate, the metal layer comprises the scan signal line, the reset control signal line, the light emission control signal line, and the gate electrodes of the driving transistor T3, the data writing transistor T4, the second light-emitting control transistor T5, the first light-emitting control transistor T6 and the first reset control transistor T7. The dotted rectangular boxes in FIG. 9 show the parts where the metal layer overlaps with the active semiconductor pattern LY1 as the channel region of respective transistors, and the portions of the active semiconductor pattern LY1 on two sides of the channel region are transformed as the first and second electrodes of the transistor (i.e., the source region and the drain region described above) by a process such as ion doping. The source electrode and the drain electrode of the transistor is symmetrical in structure, so the source electrode and the drain electrode are physically indistinguishable. In the embodiments of the present disclosure, in order to describe the transistor, in addition to the gate electrode as the control electrode, one electrode is described directly as the first electrode, the other electrode is directly described as the second electrode, so that the first and the second electrodes of all or part of the transistors in the embodiments of the present disclosure are interchangeable as needed.

For example, the semiconductor layer LY4 for forming the channel regions of the second reset transistor T1 and the threshold compensation transistor T2 in the pixel circuit is provided on the side of the active semiconductor pattern LY1 facing away from the base substrate, and the semiconductor layer LY4 includes oxide semiconductor material.

For example, FIG. 10 is the pixel circuit comprising the light-shielding layer LY0, the active semiconductor pattern LY1, the first connection layer LY2, the second connection layer LY3, the semiconductor layer LY4, and the third connection layer LY5 disposed layer by layer according to the embodiments of the present disclosure.

As shown in FIG. 10, the dotted rectangular boxes show the channel regions of the second reset transistor T1 and the threshold compensation transistor T2. For example, the second connection layer LY3 provides bottom gate structures for the second reset transistor T1 and the threshold compensation transistor T2, the semiconductor layer LY4 is overlapped with the second connection layer LY3, and the third connection layer LY5 is arranged on the side of the semiconductor layer LY4 facing away from the base substrate as the top gate structures of the second reset transistor T1 and the threshold compensation transistor T2.

For example, in the case of oxide semiconductor being used for forming the active layer of the second reset transistor T1 and the active layer of the threshold compensation transistor T2 of the pixel circuit, due to the transistors using oxide semiconductors having the characteristics of good hysteresis, low leakage current, and low mobility, oxide semiconductor is used to replace low-temperature polysilicon material in the transistors to form a low-temperature polysilicon-oxide (LTPO) pixel circuit to achieve low leakage and improve the stability of the gate voltages of the transistors.

Of course, the embodiments of the present disclosure are not limited to the active semiconductor pattern LY1 of the pixel circuit as shown in FIG. 9A, the semiconductor layer of the channel regions of the second reset transistor T1 and the threshold compensation transistor T2 may be provided in a same layer as the channel regions of other transistors, that is, the active semiconductor pattern includes the channel regions of the second reset transistor T1, the threshold compensation transistor T2, the driving transistor T3, the data writing transistor T4, the second light-emitting control transistor T5, the first light-emitting control transistor T6 and the first reset control transistor T7.

Figure 11:
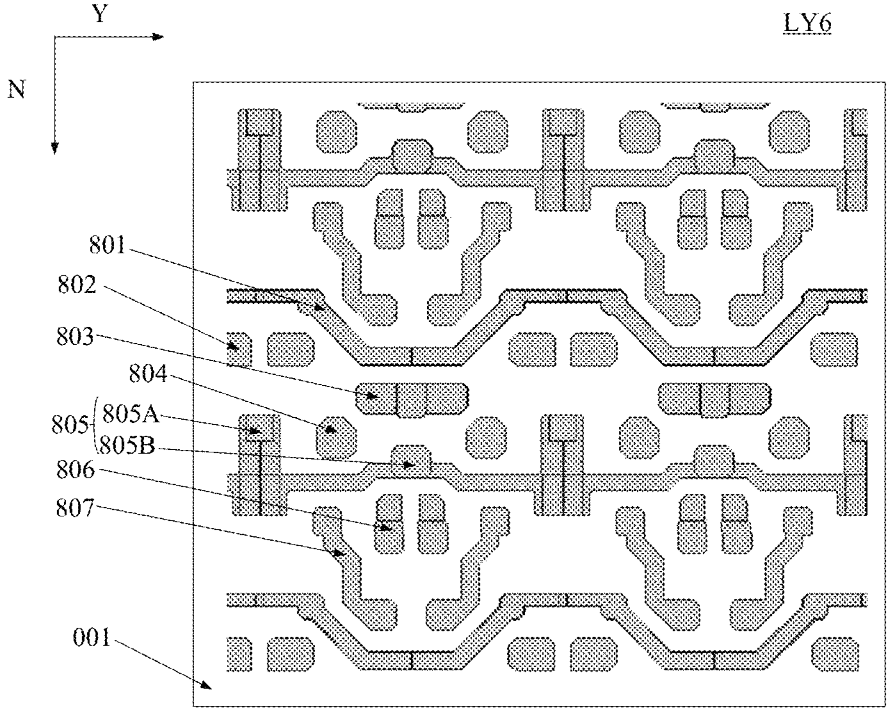
FIG. 11 is a schematic view of the local structure of the first conductive layer provided by the embodiments of the present disclosure.
Figure 12:
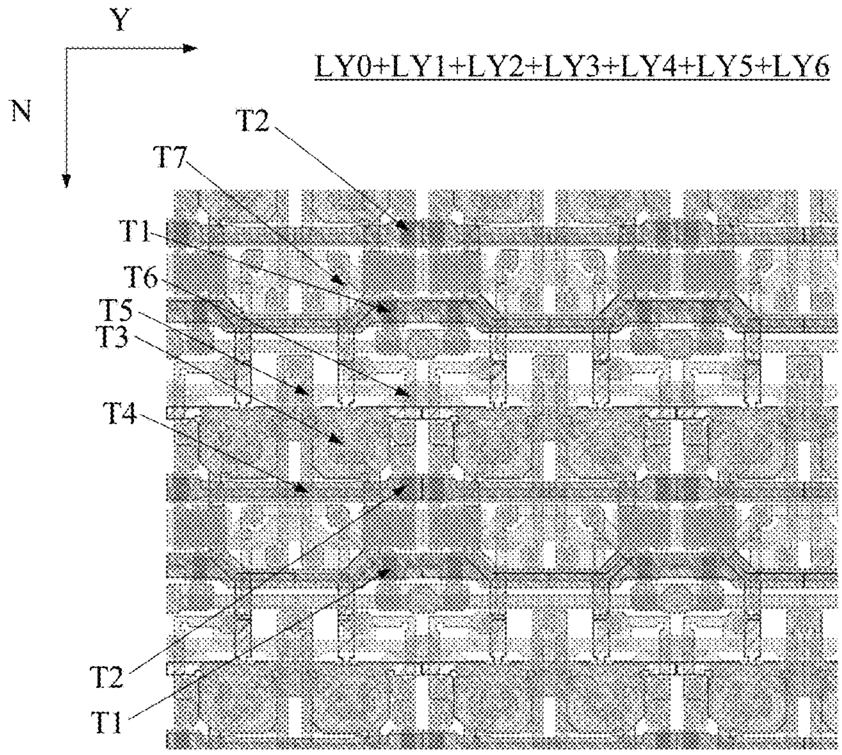
FIG. 12 is a schematic view of the stack structure of the light-shielding layer, the active semiconductor pattern, the first connection layer, the second connection layer, the semiconductor layer, the third connection layer, and the first conductive layer in the pixel circuit provided by the embodiments of the present disclosure.

FIG. 11 is a schematic view of a local structure of the first conductive layer provided by the embodiments of the present disclosure; FIG. 12 is a schematic view of the stack structure of the light-shielding layer, the active semiconductor pattern, the first connection layer, the second connection layer, the semiconductor layer, the third connection layer, and the first conductive layer in the pixel circuit provided by the embodiments of the present disclosure; FIG. 13A is a schematic view of the stack structure of the first conductive layer and the second conductive layer provided by the embodiments of the present disclosure; FIG. 13B is a schematic view of the stack structure of the first conductive layer, the second conductive layer, and the light-emitting element provided by the embodiments of the present disclosure.

For example, referring to FIG. 11A, FIG. 12, the display substrate comprises the first conductive layer LY6 (such as SD1 layer) provided between the first electrode of the light-emitting element and the third connection layer LY5, and the first conductive layer LY6 includes a reset power supply signal line 801, the reset power supply signal line 801 is electrically connected to the first electrode of the first reset transistor T7 to provide the reset signal. For example, the above reset power supply signal line 801 is a first reset power supply signal line electrically connected to the display electrode of the first reset transistor T7, the display substrate further comprises a second reset power supply signal line, a first portion of the second reset power supply signal line is provided between the first conductive layer LY6 and the gate electrode of the first reset transistor T7, and is configured to be electrically connected with the first electrode of the second reset transistor T1 to provide the reset signal.

For example, referring to FIGS. 6, 11 and 12, the first conductive layer LY6 further comprises a connection structure 802, the second conductive layer LY7 further comprises the connection block 450, the second electrode of the data writing transistor T4 is connected to the connection block 450 through the connection structure 802, and then is electrically connected with the data line 400 to receive the data signal.

For example, referring to FIGS. 6, 11 and 12, the first conductive layer LY6 further comprises a connection structure 803, and the second reset transistor T1 is electrically connected to the second reset signal line via the connection structure 803.

For example, referring to FIG. 6, FIG. 7, FIG. 11, FIG. 12 and FIG. 13, the first conductive layer LY6 further comprises a connection structure 804, the first electrode of the first light-emitting control transistor T6 and the second electrode of the first reset transistor T7 are electrically connected to the connection electrode 105 in the light-emitting element LY8 through the connection structure 804 and the second connection portion 500 in the second conductive layer LY7, and the connection structure 804 is electrically connected to the connection electrode 105.

For example, referring to FIG. 6, FIG. 11, FIG. 12 and FIG. 13, the first conductive layer LY6 further comprises a connection structure 805, the connection structure 805 includes a first connection structure 805A and a second connection structure 805B, the first electrode of the second light-emitting control transistor T5 is electrically connected to the first connection structure 805A, and the second connection structure 805B is electrically connected to the first connection portion 330 in the second conductive layer LY7, in this way, the first electrode of the second light-emitting control transistor T5 is electrically connected to the power supply signal line 300.

For example, referring to FIGS. 6 and 12, the first conductive layer LY6 further comprises a connection structure 806, the first electrode of the threshold compensation transistor T2 is electrically connected with the first electrode of the driving transistor T3 and the second electrode of the first light-emitting control transistor T6 by the connection structure 806.

For example, referring to FIG. 6 and FIG. 12, the first conductive layer LY6 further comprises a connection structure 807 to achieve an electrical connection between the second electrode of the second reset transistor T1, the second electrode of the threshold compensation transistor T2, and the gate electrode of the driving transistor T3.

Referring to FIG. 3, FIG. 6, FIG. 7, FIG. 11, FIG. 12 and FIG. 13, the orthographic projection of the connection structure 804 on the base substrate 001 and the orthographic projection of the connection block 450 on the base substrate 001 basically coincide with each other, and the orthographic projection of the connection structure 804 on the base substrate 001 and the orthographic projection of the light-emitting element 100 on the base substrate 001 do not overlap with each other, which is conducive to the design of the layout and reduces the signal interference between the light-emitting elements 100.

Figure 13:
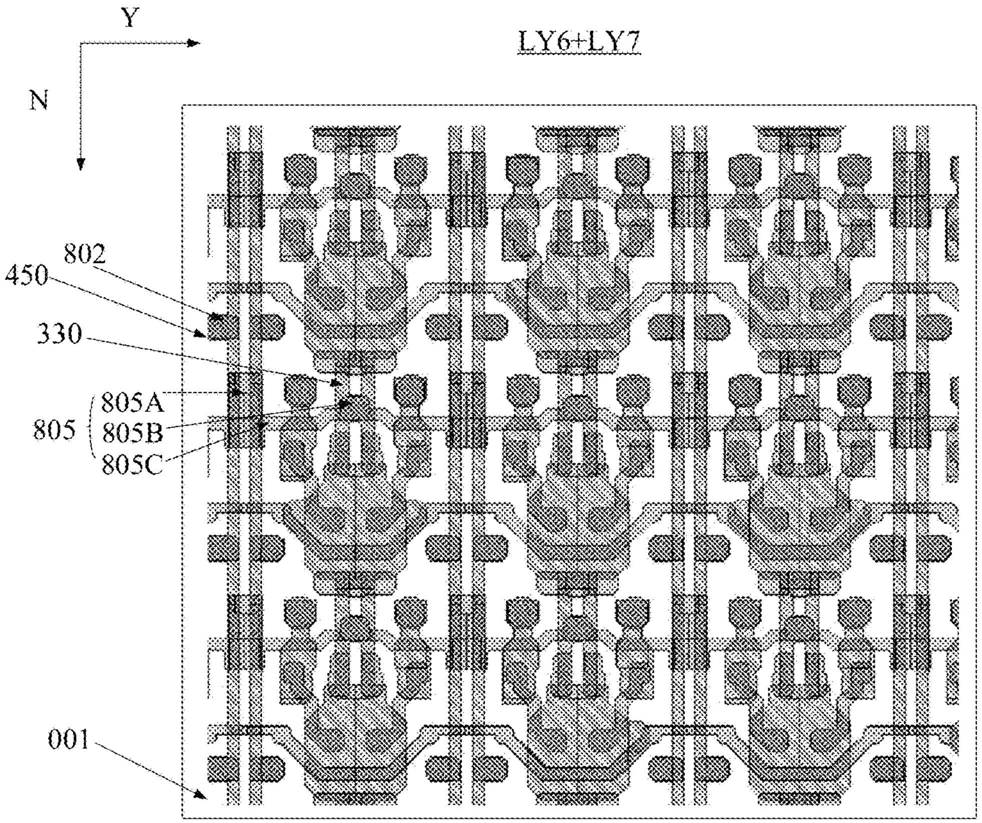
FIG. 13 is a schematic view of the stack structure of the first conductive layer and the second conductive layer provided by the embodiments of the present disclosure.

Referring to FIGS. 12 and 13, the connection structure 805 further comprises a third connection structure 805C, the first connection structure 805A and the second connection structure 805B are spaced apart from each other in the first direction N and are electrically connected by the third connection structure 805C, so that the first electrode of the second light-emitting control transistor T5 is connected to the power supply signal line 300, the connection way is flexibly adapted to the current layout arrangement, and minimizes the wiring congestion with other transistors.

Referring to FIGS. 3 and 13, the orthographic projection of the first subpixel 010 on the base substrate 001 is overlapped with each of the orthographic projection of the reset power supply signal line 801 on the base substrate 001 and the orthographic projection of the connection structure 807 on the base substrate 001, and the overlapping region is basically symmetrically distributed relative to the symmetric centerline W1 of the main electrode 1040 of the first subpixel 010, thereby facilitating the flatness of the main electrode 1040 to reduce the chromatic aberration. Similarly, the orthographic projection of the second subpixel 020 on the base substrate 001 is overlapped with each of the orthographic projection of the reset power supply signal line 801 on the base substrate 001 and the orthographic projection of the connection structure 807 on the base substrate 001, and the overlapping region is symmetrically distributed relative to the symmetric centerline W2 of the main electrode 1050 of the second subpixel 020, so that the flatness of the main electrode 1050 is good.

Referring to FIG. 3, FIG. 5, FIG. 6 and FIG. 13, the orthographic projection of the first connection structure 805A on the base substrate 001 falls into the overlapping region AS2 of the main electrode 1060 of the third subpixel 030 and the data line 400, and is basically symmetrical relative to the seventh symmetric centerline L40, thereby ensuring that the flatness of the third subpixels 030 is good to reduce the degree of chromatic aberration.

The embodiments of the present disclosure further provide a display device, including any of the above display substrates. The display device provided by the embodiments of the present disclosure is provided by designing the pixel circuit and the matching form of the pixel circuit and the light-emitting element, which is conducive to enhancing the flatness of the first electrode of the light-emitting element and reducing the chromatic aberration of the display device.

For example, the display device provided by the embodiments of the present disclosure is an organic light-emitting diode display device.

For example, the display device further includes a cover plate provided on the display side of the display substrate.

For example, the display device is a mobile phone having a camera under the screen, tablet computer, laptop, navigator and other products or components with display functions, and the embodiments of the present disclosure are not limited thereto.

The foregoing embodiments merely are exemplary embodiments of the disclosure, and not intended to define the scope of the disclosure. The scope of the disclosure is determined by the appended claims.

The invention claimed is:

1. A display substrate comprising:

a base substrate;

a plurality of subpixels on the base substrate, each of at least some of the plurality of subpixels comprising a light-emitting element and a pixel circuit, the light-emitting element comprising a light-emitting functional layer and a first electrode and a second electrode provided on two sides of the light-emitting functional layer in a direction perpendicular to the base substrate, the first electrode being provided between the light-emitting functional layer and the base substrate, the light-emitting element being at least partially provided in a light-emitting region, and the first electrode of the light-emitting element comprising a main electrode overlapping with the light-emitting region;

a plurality of power supply signal lines, at least some of the plurality of power supply signal lines extending in the first direction and arranged in a second direction, the plurality of power supply signal lines being provided between the base substrate and the first electrode of the light-emitting element, the first direction intersects the second direction, wherein the at least some of the plurality of subpixels comprise a plurality of first subpixels, at least one power supply signal line comprises a first power supply part overlapping with the main electrode of at least one of the plurality of first subpixels in a third direction perpendicular to the base substrate, the first power supply part includes a first main portion and a second main portion, in the second direction, a maximum size of the main electrode of a first subpixel is not smaller than a maximum size of its corresponding first power supply part, a maximum size of the first main portion is greater than a maximum size of the second main portion in the first power supply part, a connection line of two endpoints of the main electrode of the first subpixel farthest from each other in the second direction is an endpoint connection line;

the first main portion of the first type power supply part comprises a first protrusion, the first protrusion is provided on a side of the second main portion in the second direction and extends in the first direction, and the endpoint connection line overlaps with both the first protrusion and the first main portion in the third direction.

2. The display substrate according to claim 1, wherein the plurality of power supply signal lines include a first power supply signal line and a second power supply signal line, a maximum size of the first power supply signal line and a maximum size of the second power supply signal line in the second direction are a first size and a second size, respectively, and the second size is smaller than the first size.

3. The display substrate according to claim 1, wherein the plurality of first subpixels comprise at least one first type subpixel, the first power supply part overlapping with the main electrode of the first type subpixel is a first type power supply part, and the first main portion of the first type power supply part is an asymmetric structure.

4. The display substrate according to claim 3, wherein the first protrusion is provided on a side of a first symmetric centerline of the second main portion.

5. The display substrate according to claim 4, wherein an extension direction of a symmetric centerline of the portion of the first type power supply part except for the first protrusion intersects with an extension direction of a second symmetric centerline of the main electrode of the first type subpixel.

6. A display substrate comprising:

a base substrate;

a plurality of subpixels on the base substrate, each of at least some of the plurality of subpixels comprising a light-emitting element and a pixel circuit, the light-emitting element comprising a light-emitting functional layer and a first electrode and a second electrode provided on two sides of the light-emitting functional layer in a direction perpendicular to the base substrate, the first electrode being provided between the light-emitting functional layer and the base substrate, the light-emitting element being at least partially provided in a light-emitting region, and the first electrode of the light-emitting element comprising a main electrode overlapping with the light-emitting region;

a plurality of power supply signal lines, at least some of the plurality of power supply signal lines extending in the first direction and arranged in a second direction, the plurality of power supply signal lines being provided between the base substrate and the first electrode of the light-emitting element, the first direction intersects the second direction, wherein the at least some of the plurality of subpixels comprise a plurality of first subpixels, at least one power supply signal line comprises a first power supply part overlapping with the main electrode of at least one of the plurality of first subpixels in a third direction perpendicular to the base substrate, the first power supply part includes a first main portion and a second main portion, in the second direction, a maximum size of the main electrode of the first subpixel is not smaller than a maximum size of its corresponding first power supply part, a maximum size of the first main portion is greater than a maximum size of the second main portion in the first power supply part, a connection line of two endpoints of the main electrode of the first subpixel farthest from each other in the second direction is an endpoint connection line, and the endpoint connection line overlaps with the first main portion in the third direction;

the plurality of first subpixels comprise at least one first type subpixel, the first power supply part overlapping with the main electrode of the first type subpixel is a first type power supply part, and the first main portion of the first type power supply part is an asymmetric structure;

the first main portion of the first type power supply part comprises a first protrusion, and the first protrusion is provided on a side of a first symmetric centerline, extending in the first direction, of the second main portion;

the plurality of first subpixels further comprise at least one second type subpixel, and the first power supply part overlapping with the main electrode of the second type subpixel is a second type power supply part, the second type power supply part comprises a third symmetric centerline extending in the first direction, the main electrode of the second type subpixel comprises a fourth symmetric centerline extending in the first direction, the third symmetric centerline of the second type power supply part in a same column of power supply signal line and the fourth symmetric centerline of the second type subpixel overlapping with the second type power supply part are provided in a same plane perpendicular to the base substrate.

7. The display substrate according to claim 4, wherein the main electrode of the first subpixel comprises a first corner and a second corner opposite to each other, and a third corner and a fourth corner opposite to each other, an orthographic projection of at least one of the first corner and the second corner on the base substrate at least partially overlaps with an orthographic projection of the first symmetric centerline on the base substrate, and an orthographic projection of the fourth corner on the base substrate and an orthographic projection of the first protrusion on the base substrate at least partially overlap with each other.

8. The display substrate according to claim 6, wherein the first main portion of the second type power supply part comprises a second protrusion and a third protrusion, and the second protrusion and the third protrusion are symmetrically distributed relative to the third symmetric centerline, the main electrode of the second type subpixel comprises a first corner and a second corner opposite to each other, and a third corner and a fourth corner opposite to each other, an orthographic projection of the second protrusion on the base substrate at least partially overlaps with an orthographic projection of one of the first corner and the second corner on the base substrate, and an orthographic projection of the third protrusion on the base substrate at least partially overlaps with the orthographic projection of the other of the first corner and the second corner on the base substrate.

9. The display substrate according to claim 8, wherein in the third direction, the light-emitting region of the second type subpixel overlaps with at least one of the second protrusion and the third protrusion.

10. The display substrate according to claim 6, wherein in the second direction, a maximum size of the first main portion of the second type power supply part is greater than a maximum size of the first main portion of the first type power supply part, and a ratio of a maximum size of the second main portion of the first type power supply part to a maximum size of the second main portion of the second type power supply part is 0.9~1.1.

11. The display substrate according to claim 6, wherein a maximum size of the first main portion of the second type power supply part in the second direction is 1.1-2 times a maximum size of the second main portion of the second type power supply part in the second direction.

12. The display substrate according to claim 1, wherein each of the plurality of power supply signal lines comprises a plurality of power supply parts arranged in the first direction, and a first connection portion is provided between and electrically connected with adjacent two power supply parts, and the plurality of the power supply parts include the first power supply part, a ratio of a maximum size of the first power supply part in the second direction to a maximum size of the first connection portion in the second direction is 1.5-5, the first connection portion comprises at least one hollow-out portion, and an area of the hollow-out portion is ¼-⅓ of an area of the first connection portion.

13. The display substrate according to claim 7, wherein the first type power supply part includes a first subtype power supply part and a second subtype power supply part, the second main portion of the first type power supply part comprises a first side and a second side opposite to each other in the second direction, the first protrusion of the first subtype power supply part is disposed on the first side of the second main portion, and the first protrusion of the second subtype power supply part is disposed on the second side of the second main portion.

14. A display substrate comprising:

a base substrate;

a plurality of subpixels on the base substrate, each of at least some of the plurality of subpixels comprising a light-emitting element and a pixel circuit, the light-emitting element comprising a light-emitting functional layer and a first electrode and a second electrode provided on two sides of the light-emitting functional layer in a direction perpendicular to the base substrate, the first electrode being provided between the light-emitting functional layer and the base substrate, the light-emitting element being at least partially provided in a light-emitting region, and the first electrode of the light-emitting element comprising a main electrode overlapping with the light-emitting region;

a plurality of power supply signal lines, at least some of the plurality of power supply signal lines extending in the first direction and arranged in a second direction, the plurality of power supply signal lines being provided between the base substrate and the first electrode of the light-emitting element, the first direction intersects the second direction, wherein the at least some of the plurality of subpixels comprise a plurality of first subpixels, at least one power supply signal line comprises a first power supply part overlapping with the main electrode of at least one of the plurality of first subpixels in a third direction perpendicular to the base substrate, the first power supply part includes a first main portion and a second main portion, in the second direction, a maximum size of the main electrode of the first subpixel is not smaller than a maximum size of its corresponding first power supply part, a maximum size of the first main portion is greater than a maximum size of the second main portion in the first power supply part, a connection line of two endpoints of the main electrode of the first subpixel farthest from each other in the second direction is an endpoint connection line, and the endpoint connection line overlaps with the first main portion in the third direction;

the plurality of first subpixels comprise at least one first type subpixel, the first power supply part overlapping with the main electrode of the first type subpixel is a first type power supply part, and the first main portion of the first type power supply part is an asymmetric structure;

the first main portion of the first type power supply part comprises a first protrusion, and the first protrusion is provided on a side of a first symmetric centerline, extending in the first direction, of the second main portion;

the main electrode of the first subpixel comprises a first corner and a second corner opposite to each other, and a third corner and a fourth corner opposite to each other, an orthographic projection of at least one of the first corner and the second corner on the base substrate at least partially overlaps with an orthographic projection of the first symmetric centerline on the base substrate, and an orthographic projection of the fourth corner on the base substrate and an orthographic projection of the first protrusion on the base substrate at least partially overlap with each other;

the main electrode of the first subpixel comprises a plurality of corners, the plurality of corners include the first corner, the second corner, the third corner and the fourth corner, edges or their extension lines of the main electrode are connected in turn into a polygon, and each of a plurality of vertex angles of the polygon has a region that does not overlap with the corresponding corner of the main electrode, a non-overlapping region of the third corner and the corresponding vertex angle of the polygon is greater than a non-overlapping region of each of at least some of other corners and the corresponding vertex angle of the polygon.

15. The display substrate according to claim 1, wherein the at least some of the plurality of subpixels further comprise a plurality of second subpixels, in the third direction, the at least one power supply signal line comprises a second power supply part overlapping with the main electrode of at least one of the plurality of second subpixels, the second power supply part comprises a fifth symmetric centerline extending in the first direction, the main electrode of the second subpixel comprises a sixth symmetric centerline extending in the first direction, the fifth symmetric centerline of the second power supply part in a same column of power supply signal line and the sixth symmetric centerline of the second subpixel overlapping with the second power supply part are provided in a same plane perpendicular to the base substrate.

16. The display substrate according to claim 15, wherein an orthographic projection of the main electrode of the second subpixel on the base substrate and an orthographic projection of the second power supply part on the base substrate overlap with each other, with an overlapping region being at least 90% of an orthographic projection area of the main electrode of the second subpixel on the base substrate, in the second direction, a maximum size of the second power supply part is smaller than a maximum size of the first main portion of the first power supply part, and a ratio of the maximum size of the second power supply part and a maximum size of the second main portion of the first power supply part is 0.9~1.1.

17. The display substrate according to claim 15, further comprising:

a plurality of data lines, extending in the first direction and arranged in the second direction, the plurality of data lines and the plurality of power supply signal lines being provided in a same layer, wherein the data lines provided between adjacent two power supply signal lines comprise a first data line and a second data line arranged in the second direction, the first data line and the second data line are symmetrically distributed relative to a seventh symmetric centerline between the first data line and the second data line, the at least some of the plurality of subpixels further comprises a plurality of third subpixels, the main electrode of the light-emitting element of at least one of the plurality of third subpixels at least partially overlaps with the data line, and an overlapping region of the main electrode of the third subpixel and the data line is substantially symmetrical relative to the seventh symmetric centerline.

18. The display substrate according to claim 17, further comprising:

a plurality of second connection portions disposed in a same layer as at least some of the plurality of power supply signal lines, each second connection portion comprising a first connector and a second connector, wherein the plurality of second connection portions are arranged in an array in the first direction and the second direction to form a plurality of second-connection-portion rows and a plurality of second-connection-portion columns, the power supply signal line comprises a plurality of power supply parts arranged in the first direction, a first connection portion is provided between and electrically connected to adjacent two power supply parts, and the power supply parts of the plurality of power supply signal lines are arranged in an array in the first direction and the second direction to form a plurality of power-supply-part rows and a plurality of power-supply-part columns, the plurality of the second-connection-portion rows and the plurality of the power-supply-part rows are alternately arranged in the first direction, and two adjacent second connection portions in a same second-connection-portion row are arranged on two sides of the data line, respectively, the first connector is electrically connected to the connection electrode of the first subpixel or the connection electrode of the second subpixel, and the second connector is electrically connected to the connection electrode of the third subpixel.

19. The display substrate according to claim 18, wherein the first electrode of the light-emitting element further comprises a connection electrode electrically connected to the main electrode, the connection electrode of the light-emitting element and the first connection portion are substantially not overlapped with each other, in the first direction, a maximum size of the main electrode of the first subpixel is not smaller than a maximum size of the first main portion of the corresponding first power supply part.

* * * * *